US 9,842,653 B2

(12) United States Patent
Lee

(10) Patent No.: US 9,842,653 B2
(45) Date of Patent: *Dec. 12, 2017

(54) SEMICONDUCTOR MEMORY DEVICE AND OPERATING METHOD OF BIASING MEMORY BLOCKS

(71) Applicant: SK hynix Inc., Icheon-si Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,135

(22) Filed: Jun. 21, 2016

(65) Prior Publication Data

US 2017/0206966 A1    Jul. 20, 2017

(30) Foreign Application Priority Data

Jan. 19, 2016 (KR) ........................ 10-2016-0006584

(51) Int. Cl.
| | |
|---|---|
| *G11C 16/08* | (2006.01) |
| *G11C 16/26* | (2006.01) |
| *G11C 16/30* | (2006.01) |
| *G11C 8/08* | (2006.01) |
| *G11C 8/12* | (2006.01) |
| *G11C 16/04* | (2006.01) |

(52) U.S. Cl.
CPC ................ *G11C 16/08* (2013.01); *G11C 8/08* (2013.01); *G11C 8/12* (2013.01); *G11C 16/0483* (2013.01); *G11C 16/26* (2013.01); *G11C 16/30* (2013.01)

(58) Field of Classification Search
CPC ......... G11C 16/08; G11C 16/26; G11C 16/30; G11C 16/0483; G11C 8/08; G11C 8/12
USPC ............ 365/185.11, 185.12, 185.13, 185.18; 711/103
See application file for complete search history.

(56) References Cited

U.S. PATENT DOCUMENTS

| | | | | | |
|---|---|---|---|---|---|
| 5,245,570 | A | * | 9/1993 | Fazio ........................ | G11C 8/12 |
| | | | | | 365/185.02 |
| 5,740,107 | A | * | 4/1998 | Lee ........................... | G11C 8/16 |
| | | | | | 365/185.11 |
| 5,801,991 | A | * | 9/1998 | Keeney ..................... | G11C 8/08 |
| | | | | | 365/185.11 |
| 5,886,923 | A | * | 3/1999 | Hung ...................... | G11C 16/08 |
| | | | | | 365/185.11 |
| 9,570,176 | B2 | * | 2/2017 | Jung ....................... | G11C 16/10 |
| 2001/0000692 | A1 | * | 5/2001 | Guliani ..................... | G11O 5/14 |
| | | | | | 365/230.03 |
| 2002/0036923 | A1 | * | 3/2002 | Chung ..................... | G11C 8/10 |
| | | | | | 365/185.13 |

(Continued)

FOREIGN PATENT DOCUMENTS

| | | |
|---|---|---|
| KR | 101083680 B1 | 11/2011 |
| KR | 1020130031483 A | 3/2013 |

*Primary Examiner* — Vu Le
*Assistant Examiner* — Sung Cho
(74) *Attorney, Agent, or Firm* — William Park & Associates Ltd.

(57) ABSTRACT

In an embodiment, a method of operating a semiconductor memory device may include performing a read operation on a selected memory block, and, during the read operation, enabling local select lines to float so that potential levels of local word lines coupled to unselected memory blocks is increased.

19 Claims, 13 Drawing Sheets

(56) References Cited

U.S. PATENT DOCUMENTS

| | | | |
|---|---|---|---|
| 2002/0159315 A1* | 10/2002 | Noguchi | G11C 7/1018 365/200 |
| 2003/0043686 A1* | 3/2003 | Lee | G11C 16/08 365/244 |
| 2005/0226048 A1* | 10/2005 | Lee | G11C 16/0483 365/185.17 |
| 2005/0232012 A1* | 10/2005 | Park | G11C 16/0483 365/185.17 |
| 2005/0254302 A1* | 11/2005 | Noguchi | G11C 16/0483 365/185.17 |
| 2006/0050594 A1* | 3/2006 | Park | G11C 16/16 365/230.05 |
| 2006/0203550 A1* | 9/2006 | Lee | G11C 16/16 365/185.13 |
| 2007/0047366 A1* | 3/2007 | Lee | G11C 16/0483 365/230.03 |
| 2007/0183207 A1* | 8/2007 | Park | G11C 8/08 365/185.22 |
| 2007/0242552 A1* | 10/2007 | Ju | G11C 8/12 365/230.03 |
| 2008/0247234 A1* | 10/2008 | Lee | G11C 16/0483 365/185.13 |
| 2009/0097316 A1* | 4/2009 | Lee | G11C 16/0483 365/185.13 |
| 2009/0185422 A1* | 7/2009 | Kang | G11C 7/02 365/185.11 |
| 2009/0273984 A1* | 11/2009 | Tanzawa | G11C 16/0483 365/185.25 |
| 2009/0290420 A1* | 11/2009 | Park | G11C 16/3454 365/185.13 |
| 2010/0008165 A1* | 1/2010 | Macerola | G11C 11/5642 365/189.15 |
| 2010/0271862 A1* | 10/2010 | Yoon | G11C 8/10 365/148 |
| 2011/0051516 A1* | 3/2011 | Park | G11C 16/08 365/185.13 |
| 2011/0194366 A1* | 8/2011 | Kwon | G11C 7/02 365/195 |
| 2011/0292730 A1* | 12/2011 | Park | G11C 16/08 365/185.13 |
| 2012/0008395 A1* | 1/2012 | Kim | G11C 16/0483 365/185.11 |
| 2012/0268996 A1* | 10/2012 | Park | G11C 7/02 365/185.12 |
| 2013/0003453 A1* | 1/2013 | Park | G11C 16/0483 365/185.2 |
| 2013/0051152 A1* | 2/2013 | Lee | G11C 16/0483 365/185.18 |
| 2014/0043929 A1* | 2/2014 | Jang | G11C 8/10 365/230.04 |
| 2014/0104948 A1* | 4/2014 | Rhie | G11C 8/08 365/185.11 |
| 2014/0192596 A1* | 7/2014 | Rhie | G11C 11/5635 365/185.17 |
| 2016/0118123 A1* | 4/2016 | Jung | G11C 16/10 365/185.11 |
| 2016/0232973 A1* | 8/2016 | Jung | G11C 16/08 |

* cited by examiner

SEMICONDUCTOR MEMORY DEVICE AND OPERATING METHOD OF BIASING MEMORY BLOCKS

CROSS-REFERENCE TO RELATED APPLICATION

The present application claims priority under 35 U.S.C. §119(a) to Korean patent application number 10-2016-0006584 filed on Jan. 19, 2016 in the Korean Intellectual Property Office, the entire disclosure of which is incorporated herein by reference.

BACKGROUND

1. Technical Field

Various embodiments of the present disclosure generally relate to a semiconductor memory device and an operating method thereof, and more particularly to a semiconductor memory device with a plurality of memory blocks and an operating method thereof.

2. Related Art

Semiconductor memory devices may be classified into volatile memory devices and nonvolatile memory devices.

Although the nonvolatile memory devices have slow program/read operation speed, it can retain its data even in the absence of a power source. Therefore, the nonvolatile memory devices may be used for the task of secondary storage, which does not lose the data when the device is powered down. Examples of the nonvolatile memory devices may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into NOR type and NAND type memory.

Like a random access memory (RAM), the flash memory can be written and erased multiple times, and like the ROM, the flash memory can retain its data even when power is interrupted. Recently, the flash memory is widely used as a storage medium of portable electronic devices such as a digital camera, a smartphone, a personal digital assistant (PDA) and MP3.

SUMMARY

In an embodiment of the present disclosure, a method of operating a semiconductor memory device may include performing a read operation of a selected memory block, and, during the read operation, enabling local select lines to float so that potential levels of local word lines coupled to unselected memory blocks are increased.

In an embodiment of the present disclosure, a method of operating a semiconductor memory device may include performing a read operation of a selected memory block, and, during the read operation, pulling local select lines coupled to unselected memory blocks to ground.

In an embodiment of the present disclosure, a semiconductor memory device may include a plurality of memory blocks, local select lines and local word lines coupled to the respective memory blocks, a voltage generation circuit, select line pass circuits, word line pass circuits, a block decoder, and a control logic. The voltage generation circuit may output operating voltage of various levels to global select lines and global word lines. The select line pass circuits may selectively couple or decouple the global select lines and the local select lines. The word line pass circuits may couple or decouple, in common, the global word lines and the local word lines. The block decoder may control the word line pass circuits in common. The control logic may control, in response to a command, the voltage generation circuit, the select line pass circuits, and the block decoder.

According to an embodiment of the present disclosure, during a read operation of a semiconductor memory device, the potential levels of word lines and select lines of an unselected memory block are controlled to prevent hot carriers (e.g., holes) from being trapped in a channel of the unselected memory block. As a result, the reliability of the read operation of the unselected memory block can be improved.

DETAILED DESCRIPTION

Figure 1:
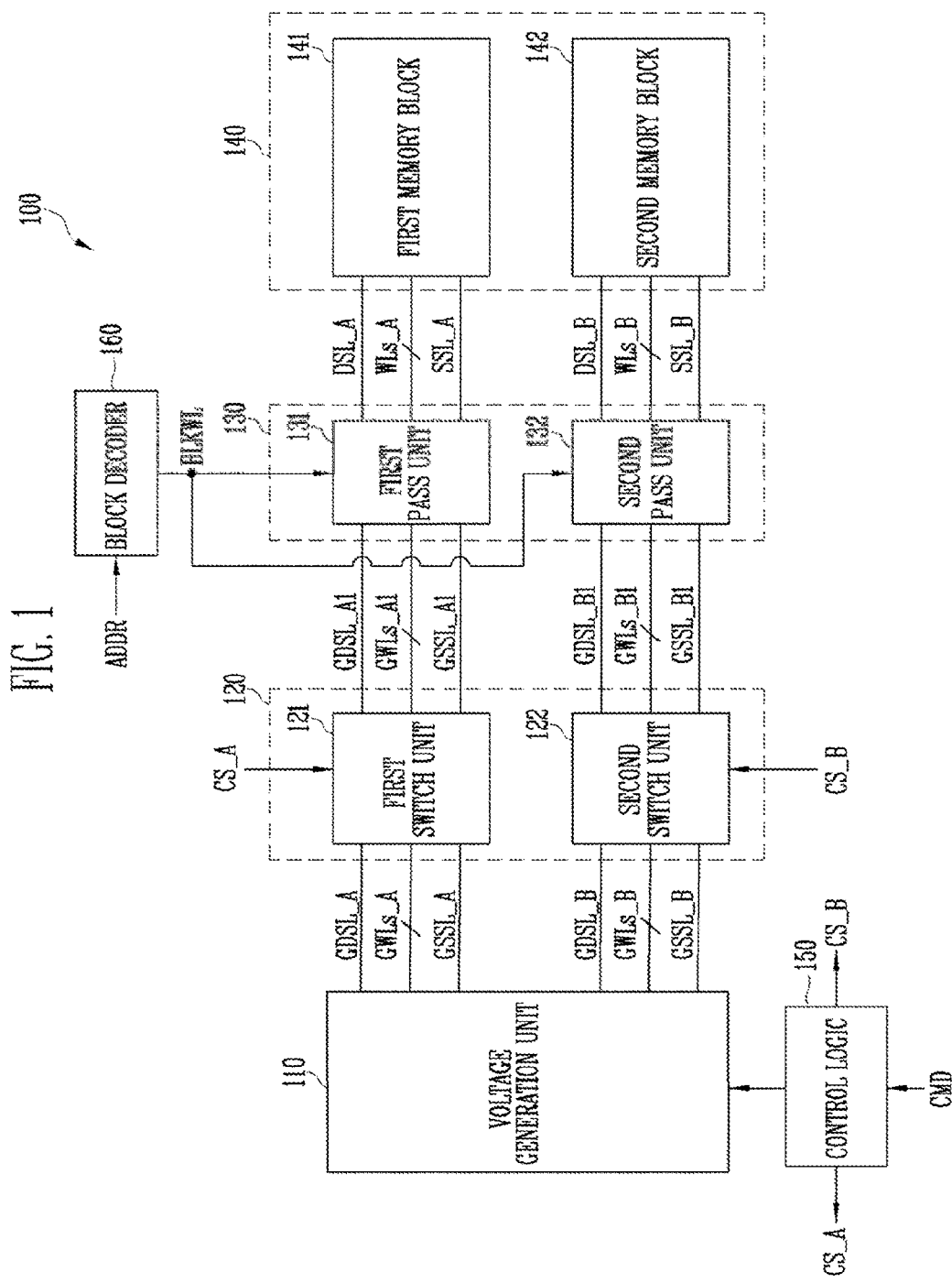
FIG. 1 is a diagram illustrating a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Advantages and features of the present disclosure, and methods for achieving the same will be cleared with reference to exemplary embodiments described later in detail together with the accompanying drawings. Accordingly, the present disclosure is not limited to the following embodiments but may be embodied in other types. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebteween. In the specification, when an element is referred to as "comprising" or "including" a component, it does not preclude another component but may further include other components unless the context clearly indicates otherwise.

FIG. 1 is a diagram illustrating a semiconductor memory device according to an embodiment of the present disclosure.

Referring to FIG. 1, the semiconductor memory device 100 may include a voltage generation circuit 110, a switching circuit 120, a pass circuit group 130, a memory unit 140, a control logic 150, and a block decoder 160.

The voltage generation circuit 110 may generate, during a read operation, operating voltages having various levels in response to an operation signal output from the control logic 150, and may output the operating voltages to global word lines and global select lines. For example, the operating voltages may include a read voltage, a pass voltage, a select transistor control voltage, a compensation voltage, and so forth. The voltage generation circuit 110 may transmit operating voltages having various levels to first global word lines GWLs_A, first global select lines GDSL_A and GSSL_A, second global word lines GWLs_B and second global select lines GDSL_B and GSSL_B. For example, in a case where a first memory block 141 is selected between first and second memory blocks 141 and 142 of the memory circuit 140, the voltage generation circuit 210 may transmit operating voltages to the first global word lines GWLs_A and the first global select lines GDSL_A and GSSL_A assigned to the first memory block 141, and may transmit a voltage of zero volts or a compensation voltage lower than the operating voltages to the second global word lines GWLs_B and the second global select lines GDSL_B and GSSL_B assigned to the unselected second memory block 142. The compensation voltage may be set within a range, for example, from zero volts to four volts. The voltage of zero volts can be obtained by coupling a selected line to a ground terminal. The switching circuit 120 may include a first switching circuit 121 and a second switching circuit 122.

The first switching circuit 121 may couple the first global word lines GWLs_A to first sub-global word lines GWLs_A1, and may couple the first global select lines GDSL_A and GSSL_A to first sub-global select lines GDSL_A1 and GSSL_A1. For instance, the first switching circuit 121 may include high-voltage transistors that are turned on or off in response to a select control voltage CS_A. In response to a select control voltage CS_A output from the control logic 150, the first switching circuit 121 may transmit operating voltages or compensation voltages applied through the first global word lines GWLs_A, to the first sub-global word lines GWLs_A1, or may enable the first sub-global word lines GWLs_A1 to float. In response to a select control voltage CS_A output from the control logic 150, the first switching circuit 121 may transmit a plurality of operating voltages or compensation voltages that are input through the first global select lines GDSL_A and GSSL_A, to the first sub-global select lines GDSL_A1 and GSSL_A1, or may enable the first sub-global select lines GDSL_A1 and GSSL_A1 to float. The select control voltage CS_A may be a voltage of zero volts or a high-voltage that is higher than a plurality of operating voltages input through the first global word lines GWLs_A and the first global select lines GDSL_A and GSSL_A.

The second switching circuit 122 may couple the second global word lines GWLs_B to second sub-global word lines GWLs_B1, and may couple the second global select lines GDSL_B and GSSL_B to second sub-global select lines GDSL_B1 and GSSL_B1. For instance, the second switching circuit 122 may include high-voltage transistors that are turned on or off in response to an unselect control voltage CS_B. In response to an unselect control voltage CS_B output from the control logic 150, the second switching circuit 122 may transmit a plurality of operating voltages or compensation voltages input through the second global word lines GWLs_B, to the second sub-global word lines GWLs_B1, or may enable the second sub-global word lines GWLs_B1 to float, In response to an unselect control voltage CS_B output from the control logic 150, the second switching circuit 122 may transmit a plurality of operating voltages input through the second global select lines GDSL_B and GSSL_B, to the second sub-global select lines GDSL_B1 and GSSL_B1, or may enable the second sub-global select lines GDSL_B1 and GSSL_B1 to float. The unselect control voltage CS_B may be a voltage ranging from zero volts to four volts or a high-voltage higher than a plurality of operating voltages input through the second global word lines GWLs_B and the second global select lines GDSL_B and GSSL_B.

During a read operation, when the first memory block 141 is selected between the first memory block 141 and the second memory block 142, in response to a select control voltage CS_A output from the control logic 150, the first switching circuit 121 may transmit, to the first sub-global word lines GWLs_A1, a plurality of operating voltages input through the first global word lines GWLs_A. In addition, the first switching circuit 121 may transmit, to the first sub-global select lines GDSL_A1 and GSSL_A1, a plurality of operating voltages input through the first global select lines GDSL_A and GSSL_A. In response to an unselect control voltage CS_B, the second switching circuit 122 assigned to the unselected second memory block 142 may enable the second-sub global word lines GWLs_B1 and the second sub-global select lines GDSL_B1 and GSSL_B1 to float. That is, during the read operation, the switching circuit 120 may enable the sub-global word lines and sub-global select lines assigned to the unselected memory block to float.

The pass circuit group 130 may include a first pass circuit 131 and a second pass circuit 132.

In response to a block pass signal BLKWL output from the block decoder 160, the first pass circuit 131 may electrically couple the first sub-global word lines GWLs_A1 to first word lines WLs_A of the first memory block 141, and may electrically couple the first sub-global select lines GDSL_A1 and GSSL_A1 to first select lines DSL_A and SSL_A of the first memory block 141. Here, the select lines DSL_A and SSL_A may be local select lines.

In response to the block pass signal BLKWL output from the block decoder 160, the second pass circuit 132 may electrically couple the second sub-global word lines GWLs_B1 to second word lines WLs_B of the second memory block 142, and may electrically couple the second sub-global select lines GDSL_B1 and GSSL_B1 to second select lines DSL_B and SSL_B of the second memory block 142.

The first and second pass circuits 131 and 132 may share a signal line carrying the block pass signal BLKWL provided from the block decoder 160. Therefore, in response to the same block pass signal BLKWL, the first sub-global word lines GWLs_A1 and the first word lines WLs_A of the first memory block 141 may be electrically coupled to each other, and the first sub-global select lines GDSL_A1 and GSSL_A1 and the first select lines DSL_A and SSL_A of the first memory block 141 may be electrically coupled to each other, and the second sub-global word lines GWLs_B1 and the second word lines WLs_B of the second memory block 142 may be electrically coupled to each other, and the second sub-global select lines GDSL_B1 and GSSL_B1 and the second select lines DSL_B and SSL_B of the second memory block 142 may be electrically coupled to each other. The first and second pass circuits 131 and 132 may include a plurality of high-voltage transistors that are turned on or off in response to the block pass signal BLKWL. Although the first and second pass circuits 131 and 132 are coupled to the same signal line providing the block pass signal BLKWL, the block pass signal BLKWL may be applied to only one of the first and second memory blocks 141 and 142 by turning on only one of the first and second switching circuits.

The memory unit 140 may include the first memory block 141 and the second memory block 142. Each of the first and second memory blocks 141 and 142 may include a plurality of memory cells. For example, the plurality of memory cells may be nonvolatile memory cells. Among the plurality of memory cells, memory cells coupled to the same word line may be defined as one page. Each of the first and second memory blocks 141 and 142 may include a plurality of cell strings. The first memory block 141 and the second memory block 142 may share common source line and bit lines.

The control logic 150 may control the voltage generation circuit 110 and the switching circuit 120 in response to a command CMD provided from an external device. For example, if a command related to a read operation is input, the control logic 150 may output an operation signal to the voltage generation circuit 110 such that various operating voltages are generated, and may output a select control voltage CS_A and an unselect control voltage CS_B for controlling the first switching circuit 121 and the second switching circuit 122 assigned to a selected memory block and an unselected memory block of the memory unit 140.

When a memory block corresponding to a row address ADDR is the first memory block 141 or the second memory block 142, the block decoder 160 may generate a block pass signal BLKWL having a high-voltage level. The row address ADDR may be output from the control logic 150.

Figure 2:
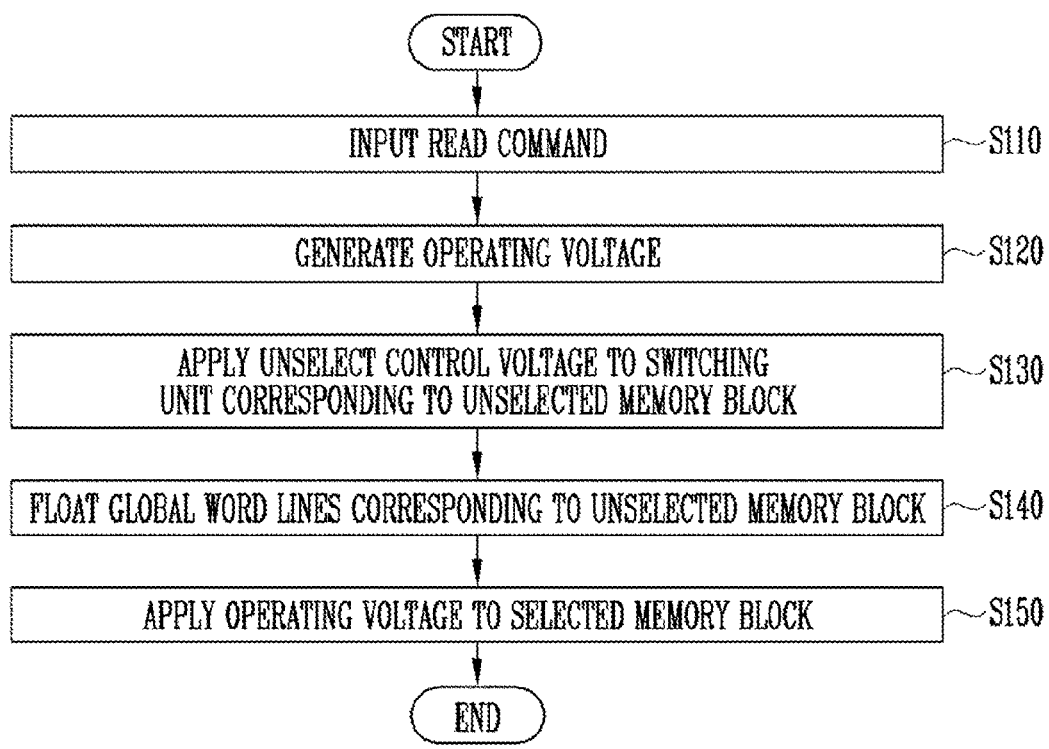
FIG. 2 is a flowchart illustrating an operation according to an embodiment of the semiconductor memory device illustrated in FIG. 1.

FIG. 2 is a flowchart illustrating an operation according to an embodiment of the semiconductor memory device illustrated in FIG. 1.

The operation of the semiconductor memory device according to an embodiment of the present disclosure will be described with reference to FIGS. 1 to 2.

Here, it is assumed that the first memory block 141 is a selected memory block, which is a memory block selected between the first and second memory blocks 141 and 142.

1) Inputting a Read Command (S110)

When a read command CMD related to a read operation is input from the external device, the control logic 150 may generate a control signal and control voltages for controlling the voltage generation circuit 110 and the switching circuit 120.

2) Generating Operating Voltages (S120)

The voltage generation circuit 110 may generate operating voltages having various levels for the read operation in response to control signals provided from the control logic 150. For example, the operating voltages may include a read voltage, a pass voltage, a select transistor control voltage, a compensation voltage, and so forth. The voltage generation circuit 110 may provide the operating voltages to the first global word lines GWLs_A and the first global select lines GDSL_A and GSSL_A. Furthermore, the voltage generation circuit 110 may provide a voltage of zero volts to the second global word lines GWLs_B and the second global select lines GDSL_B and GSSL_B.

3) Applying an Unselect Control Voltage to a Switching Circuit Assigned to an Unselected Memory Block (S130)

An unselect control voltage CS_B may be applied to the second switching circuit 122 assigned to the unselected second memory block 142. A select control voltage CS_A of a high voltage output from the control logic 150 may be applied to the first switching circuit 121 assigned to the selected first memory block 141. The unselect control voltage CS_B may be set to zero volts.

4) Floating the Global Word Lines Assigned to the Unselected Memory Block (S140)

In response to the unselect control voltage CS_B output from the control logic 150, the second switching circuit 122 assigned to the unselected second memory block 142 may float the second-sub global word lines GWLs_B1 and the second sub-global select lines GDSL_B1 and GSSL_B1 assigned to the unselected second memory block 142. For example, the first switching circuit 121 may transmit, in response to the select control voltage CS_A of a high voltage output from the control logic 150, the plurality of operating voltages input through the first global word lines GWLs_A and the first global select lines GDSL_A and GSSL_A, to the first sub-global word lines GWLs_A1 and the first sub-global select lines GDSL_A1 and GSSL_A1. The second switching circuit 122 may be turned off in response to the unselect control voltage CS_B of zero volts, and may enable the second sub-global word lines GWLs_B1 and the second sub-global select lines GDSL_B1 and GSSL_B1 to float.

5) Applying an Operating Voltage to the Selected Memory Block (S150)

During the read operation, a voltage of zero volts may be applied to the common source line shared by the first memory block 141 and the second memory block 142, and bit lines shared by the first memory block 141 and the second memory block 142 may be pre-charged.

In a case where the first memory block 141 is a selected memory block and the second memory block 142 is an unselected memory block, the block decoder 160 may generate a block pass signal BLKWL having a high-voltage level in response to a row address ADDR.

In response to the block pass signal BLKWL, the first pass circuit 131 may electrically couple the first sub-global word lines GWLs_A1 and the first word lines WLs_A to each other, and may electrically couple the first sub-global select lines GDSL_A1 and GSSL_A1 and the first select lines DSL_A and SSL_A to each other.

In response to the block pass signal BLKWL, the second pass circuit 132 may electrically couple the second sub-global word lines GWLs_B1 and the second word lines WLs_B to each other, and may electrically couple the second sub-global select lines GDSL_B1 and GSSL_B1 and the second select lines DSL_B and SSL_B to each other.

A read voltage and a pass voltage may be applied to the first word lines WLs_A of the selected first memory block 141, and a select transistor control voltage may be applied to the first select lines DSL_A and SSL_A. ALL of the second word lines WLs_B and the second select lines DSL_B and SSL_B of the unselected second memory block 142 may float.

The potential levels of the floating second word lines WLs_B and the floating second select lines DSL_B and SSL_B may be increased by capacitive coupling with adjacent wiring lines and terminals. In the case where the potential level of the second word lines WLs_B and the second select lines DSL_B and SSL_B exceeds zero volts by the capacitive coupling phenomenon, a generation of hot carriers (e.g., hot holes) that may be formed due to a generation of leakage current (e.g., GIDL) in the channels of the drain and source select transistors may be suppressed. Therefore, a probability that hot carriers (e.g., hot holes) are injected and trapped in the channels of the unselected memory block may decrease.

The following Table 1 shows an embodiment of the potential levels of the word lines and the select lines of a selected memory block and an unselected memory block among the plurality of memory blocks assigned to the pass circuits sharing one block pass signal.

TABLE 1

| | Selected memory block | | | Unselected memory block | | |
|---|---|---|---|---|---|---|
| | Sub-global line | Block pass signal | Local line | Sub-global line | Block pass signal | Local line |
| GSSL/SSL | Vssl | High voltage | Vssl | Floating | High voltage | Floating |
| GDSL/DSL | Vdsl | | Vdsl | Floating | | Floating |
| GWLs/WLs | Read voltage or pass voltage | | Read voltage or pass voltage | Floating | | Floating |

As shown in Table 1, a read voltage and a pass voltage may be applied to word lines of a selected memory block, which is a memory block selected from among a plurality of memory blocks. Here, the selected memory block may be coupled to pass circuits that share a certain block pass signal. Therefore, a block pass signal may be applied to not only to the selected memory block, but also to the unselected memory block. Select transistor control voltages Vssl and Vdsl of a positive voltage may be applied to select lines of the selected memory block. As described above, all of the word lines and select lines of the unselected memory block may float. Thus, during a read operation of the selected memory block, in the unselected memory block, a probability that hot carriers (e.g., hot holes) are formed in lower channels of the drain and source select transistors may decrease.

Figure 3:
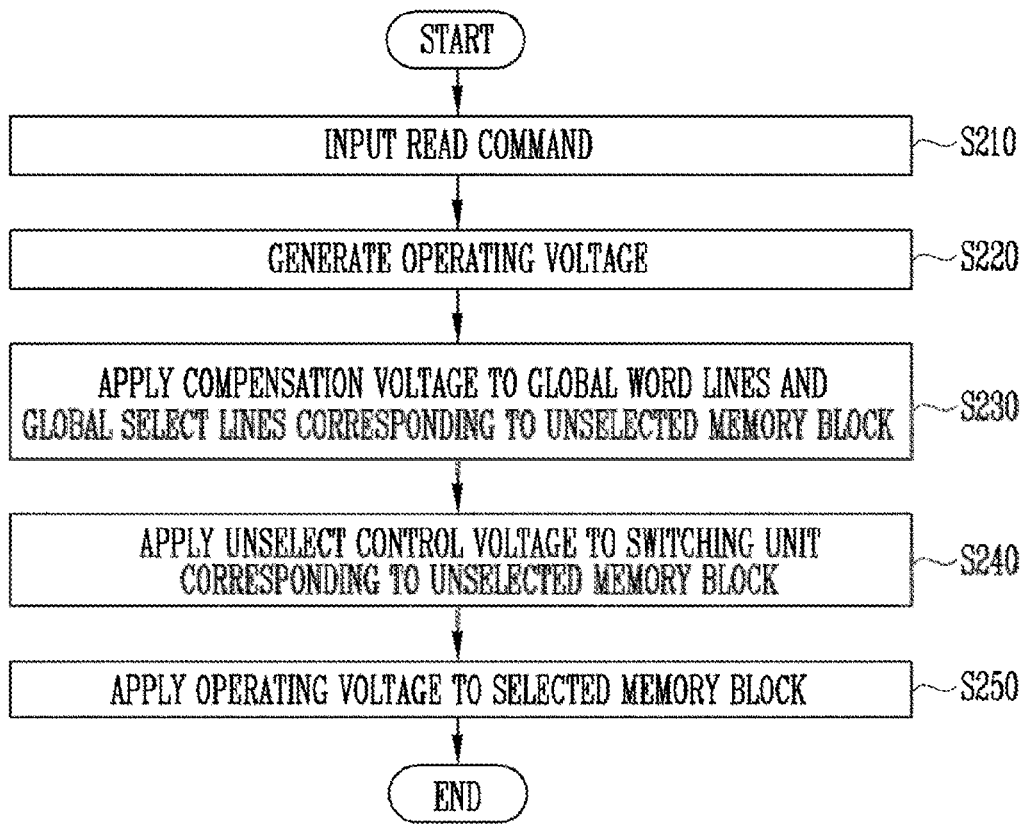
FIG. 3 is a flowchart illustrating an operation according to an embodiment of the semiconductor memory device illustrated in FIG. 1.

FIG. 3 is a flowchart illustrating an operation according to an embodiment of the semiconductor memory device illustrated in FIG. 1.

The operation of the semiconductor memory device according to an embodiment will be described with reference to FIGS. 1 and 3.

Here, it is assumed that the first memory block 141 is selected between the first and second memory blocks 141 and 142.

1) Inputting a Read Command (S210)

When a read command CMD related to a read operation is input from the external device, the control logic 150 may generate a control signal and control voltages for controlling the voltage generation circuit 110 and the switching circuit 120.

2) Generating Operating Voltages (S220)

The voltage generation circuit 110 may generate operating voltages having various levels for the read operation in response to control signals provided from the control logic 150. For example, the operating voltages may include a read voltage, a pass voltage, a select transistor control voltage, a compensation voltage, and so forth. The voltage generating circuit 110 may provide voltages such as the read voltage, the pass voltage, and the select transistor control voltage to the first global word lines GWLs_A and the first global select lines GDSL_A and GSSL_A. Furthermore, the voltage generation circuit 110 may provide compensation voltages to the second global word lines GWLs_B and the second global select lines GDSL_B and GSSL_B.

3) Applying Compensation Voltages to Global Word Lines and Global Select Lines Corresponding to an Unselected Memory Block (S230)

The voltage generation circuit 110 may apply compensation voltages to the second global word lines GWLs_B and global select lines GDSL_B and GSSL_B that correspond to the unselected second memory block 142. For example, the voltage generation circuit 110 applies operating voltages to the first global word lines GWLs_A and the first global select lines GDSL_A and GSSL_A that correspond to the selected first memory block 141. The voltage generation circuit 110 may apply compensation voltages to the second global word lines GWLs_B and the second global select lines GDSL_B and GSSL_B that correspond to the unselected second memory block 142. A compensation voltage applied to the second global word lines GWLs_B may be a positive voltage, and may be set within a range between zero volts and four volts. A compensation voltage applied to the second global select lines GDSL_B and GSSL_B may be a voltage of zero volts.

4) Applying an Unselect Control Voltage to a Switching Circuit Corresponding to the Unselected Memory Block (S240)

An unselect control voltage CS_B may be applied to the second switching circuit 122 that corresponds to the unselected second memory block 142. A high-voltage select control voltage CS_A output from the control logic 150 may be applied to the first switching circuit 121 that corresponds to the selected first memory block 141. The unselect control voltage CS_B may be set to have a level higher than the compensation voltage. For example, the unselect control voltage CS_B may be set to four volts.

5) Applying an Operating Voltage to the Selected Memory Block (S250)

During the read operation, a voltage of zero volts may be applied to the common source line shared by the first memory block 141 and the second memory block 142, and bit lines shared by the first memory block 141 and the second memory block 142 may be pre-charged.

In a case where the first memory block 141 is a selected memory block and the second memory block 142 is an unselected memory block, the block decoder 160 may generate a block pass signal BLKWL having a high-voltage level in response to a row address ADDR.

In response to a block pass signal BLKWL, the first pass circuit 131 may electrically couples the first sub-global word lines GWLs_A1 to first word lines WLs_A of the first memory block 141, and may electrically couple the first sub-global select lines GDSL_A1 and GSSL_A1 to the select lines DSL_A and SSL_A of the first memory block 141.

In response to a block pass signal BLKWL, the second pass circuit 132 may electrically couple the second sub-global word lines GWLs_B1 to the second word lines WLs_B of the second memory block 142, and may electrically couple the second sub-global select lines GDSL_B1 and GSSL_B1 to the second select lines DSL_B and SSL_B of the second memory block 142.

A read voltage and a pass voltage may be applied to the first word lines WLs_A of the selected first memory block 141, and a select transistor control voltage may be applied to the first select lines DSL_A and SSL_A. A compensation voltage ranging from zero volts to four volts may be applied to the second word lines WLs_B of the unselected second memory block 142, and a compensation voltage of zero volts may be applied to the second select lines DSL_B and SSL_B.

A compensation voltage of zero volts may be applied to the second select lines DSL_B and SSL_B, so that a probability that hot carriers (e.g., hot holes) are formed due to generation of leakage current (e.g., GIDL) in the lower channels of the drain and source select transistors may decrease. Furthermore, because a compensation voltage ranging from zero volts to four volts is applied to the second word lines WLs_B, a probability that hot carriers (e.g., hot holes) are injected and trapped in the channel of the memory block may decrease.

The following Table 2 shows the potential levels of the word lines and the select lines of a selected memory block and an unselected memory block among the plurality of memory blocks that correspond to the pass circuits sharing one block pass signal.

TABLE 2

| | Selected memory block | | | Unselected memory block | | |
|---|---|---|---|---|---|---|
| | Sub-global line | Block pass signal | Local line | Sub-global line | Block pass signal | Local line |
| GSSL/ SSL | Vssl | High voltage | Vssl | 0V | High voltage | 0V |
| GDSL/ DSL | Vdsl | | Vdsl | 0V | | 0V |
| GWLs/ WLs | Read voltage | | Read voltage | Compensation | | Compensation |

TABLE 2-continued

| | Selected memory block | | | Unselected memory block | | |
|---|---|---|---|---|---|---|
| | Sub-global line | Block pass signal | Local line | Sub-global line | Block pass signal | Local line |
| | or pass voltage | | or pass voltage | voltage | | voltage |

As shown in Table 2, a read voltage and a pass voltage may be applied to word lines of a memory block selected from among a plurality of memory blocks corresponding to pass circuits that share one block pass signal, and select transistor control voltages Vssl and Vdsl of a positive voltage may be applied to select lines thereof. As described above, a compensation voltage having a level ranging from zero volts to four volts may be applied to the word lines of the unselected memory block, and a compensation voltage of zero volts may be applied to the select lines. Therefore, during a read operation of the selected memory block, in the unselected memory block, a probability that hot carriers (e.g., hot holes) are formed in the lower channels of the drain and source select transistors may decrease, and a probability that hot carriers (e.g., hot holes) are injected and trapped in the channel of the memory block may decrease. Leakage current flowing through the cell strings in the second memory block 242 may be reduced.

Figure 4:
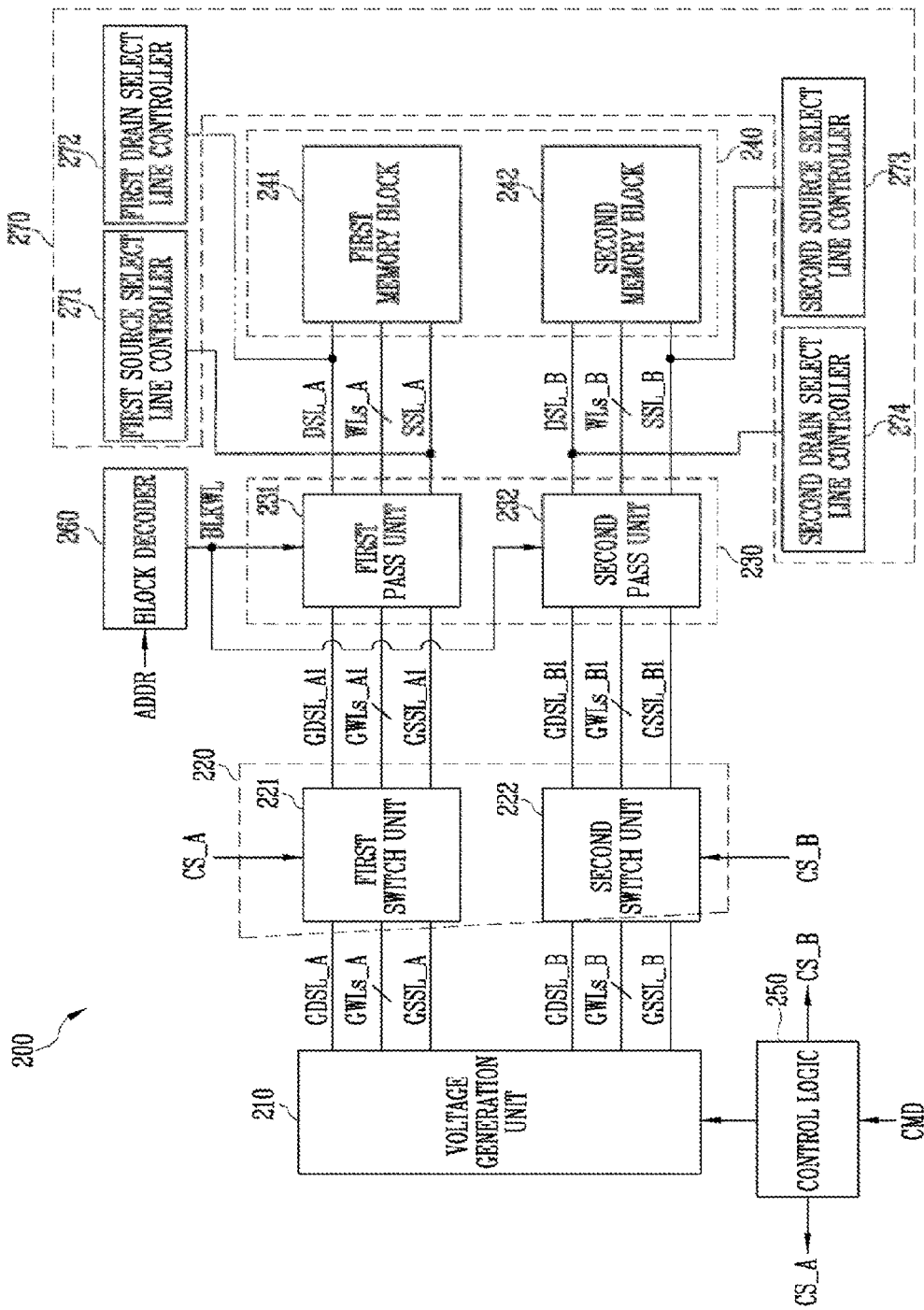
FIG. 4 is a diagram illustrating a semiconductor memory device according to an embodiment of the present disclosure.

FIG. 4 is a diagram illustrating a semiconductor memory device according to an embodiment of the present disclosure.

Referring to FIG. 4, the semiconductor memory device 200 may include a voltage generation circuit 210, a switching circuit 220, a pass circuit group 230, a memory unit 240, a control logic 250, a block decoder 260 and a select line control circuit 270.

The voltage generation circuit 210 may generate, during a read operation, operating voltages having various levels in response to an operating signal output from the control logic 250, and may output the operating voltages to global word lines and global select lines. For example, the operating voltages may include a read voltage, a pass voltage, a select transistor control voltage, a compensation voltage, and so forth. The voltage generation circuit 210 may transmit operating voltages having various levels to first global word lines GWLs_A, first global select lines GDSL_A and GSSL_A, second global word lines GWLs_B and second global select lines GDSL_B and GSSL_B. For example, in a case where a first memory block 241 is selected between first and second memory blocks 241 and 242 of the memory circuit 240, the voltage generation circuit 210 may transmit operating voltages to the first global word lines GWLs_A and the first global select lines GDSL_A and GSSL_A that correspond to the first memory block 241, and may transmit a voltage of zero volts to the second global word lines GWLs_B and the second global select lines GDSL_B and GSSL_B assigned to the unselected second memory block 242.

The switching circuit 220 may include a first switching circuit 221 and a second switching circuit 222.

The first switching circuit 221 may couple the first global word lines GWLs_A to first sub-global word lines GWLs_A1, and may couple the first global select lines GDSL_A and GSSL_A to first sub-global select lines GDSL_A1 and GSSL_A1. For instance, the first switching circuit 221 may include high-voltage transistors that are turned on or off in response to a select control voltage CS_A.

In response to a select control voltage CS_A output from the control logic 250, the first switching circuit 221 may transmit a plurality of operating voltages input through the first global word lines GWLs_A, to the first sub-global word lines GWLs_A1, or may let the first sub-global word lines GWLs_A1 float. In response to a select control voltage CS_A output from the control logic 250, the first switching circuit 221 may transmit a plurality of operating voltages input through the first global select lines GDSL_A and GSSL_A, to the first sub-global select lines GDSL_A1 and GSSL_B1, or may let the first sub-global select lines GDSL_A1 and GSSL_A1 float. The select control voltage CS_A may be a voltage of zero volts or a high-voltage that is higher than a plurality of operating voltages input through the first global word lines GWLs_A and the first global select lines GDSL_A and GSSL_A.

The second switching circuit 222 may couple the second global word lines GWLs_B to second sub-global word lines GWLs_B1, and may couple the second global select lines GDSL_B and GSSL_B to second sub-global select lines GDSL_B1 and GSSL_B1. For instance, the second switching circuit 222 may include high-voltage transistors that are turned on or off in response to an unselect control voltage CS_A. In response to an unselect control voltage CS_B output from the control logic 250, the second switching circuit 222 may transmit a plurality of operating voltages input through the second global word lines GWLs_B, to the second sub-global word lines GWLs_B1, or may let the second sub-global word lines GWLs_B1 float. In response to an unselect control voltage CS_B output from the control logic 250, the second switching circuit 222 may transmit a plurality of operating voltages input through the second global select lines GDSL_B and GSSL_B, to the second sub-global select lines GDSL_B1 and GSSL_B1, or may let the second sub-global select lines GDSL_B1 and GSSL_B1 float. The unselect control voltage CS_B may be a voltage of zero volts or a high-voltage higher than a plurality of operating voltages input through the second global word lines GWLs_B and the second global select lines GDSL_B and GSSL_B.

During a read operation, when the first memory block 241 is selected between the first memory block 242 and the second memory block 241, in response to a select control voltage CS_A output from the control logic 250, the first switching circuit 221 transmits a plurality of operating voltages input through the first global word lines GWLs_A, to the first sub-global word lines GWLs_A1, and may transmit a plurality of operating voltages input through the first global select lines GDSL_A and GSSL_A to the first sub-global select lines GDSL_A1 and GSSL_A1. The second switching circuit 222 corresponding to the unselected second memory block 242 floats, in response to an unselect control voltage CS_B, the second-sub global word lines GWLs_B1 and the second sub-global select lines GDSL_B1 and GSSL_B1. That is, the switching circuit 220 floats the sub-global word lines and sub-global select lines that correspond to the unselected memory block.

The pass circuit group 230 may include a first pass circuit 231 and a second pass circuit 232.

In response to a block pass signal BLKWL output from the block decoder 260, the first pass circuit 231 may electrically couple the first sub-global word lines GWLs_A1 to first word lines WLs_A of the first memory block 241, and may electrically couple the first sub-global select lines GDSL_A1 and GSSL_A1 to the first select lines DSL_A and SSL_A of the first memory block 241.

In response to a block pass signal BLKWL output from the block decoder 260, the second pass circuit 232 may electrically couple the second sub-global word lines GWLs_B1 to second word lines WLs_B of the second memory block 142, and may electrically couple the second sub-global select lines GDSL_B1 and GSSL_B1 to second select lines DSL_B and SSL_B of the second memory block 242.

The first and second pass circuits 231 and 232 may share a signal line carrying the block pass signal BLKWL provided from the block decoder 260. Therefore, in response to the same block pass signal BLKWL, the first sub-global word lines GWLs_A1 may be electrically coupled to the first word lines WLs_A of the first memory block 241, and the first sub-global select lines GDSL_A1 and GSSL_A1 and the first select lines DSL_A and SSL_A of the first memory block 241 may be electrically coupled to each other, and the second sub-global word lines GWLs_B1 may be electrically coupled to the second word lines WLs_B of the second memory block 242, and the second sub-global select lines GDSL_B1 and GSSL_B1 and the second select lines DSL_B and SSL_B of the second memory block 242 may be electrically coupled to each other. The first and second pass circuits 231 and 232 may include a plurality of high-voltage transistors that are turned on or off in response to the block pass signal BLKWL. Although the first and second pass circuits 231 and 232 are coupled to the same signal line providing the block pass signal BLKWL, the block pass signal BLKWL may be applied to only one of the first and second memory blocks 241 and 242 by turning on only one of the first and second switching circuits.

The memory unit 240 may include the first memory block 241 and the second memory block 242. Each of the first and second memory blocks 241 and 242 may include a plurality of memory cells. For example, the plurality of memory cells may be nonvolatile memory cells. Among the plurality of memory cells, memory cells coupled to the same word line may be defined as one page. Each of the first and second memory blocks 241 and 242 may include a plurality of cell strings. The first memory block 241 and the second memory block 242 may share common source line and bit lines.

The control logic 250 may control the voltage generation circuit 210 and the switching circuit 220 in response to a command CMD provided from the external device. For example, if a command related to a read operation is input, the control logic 250 may control the voltage generation circuit 210 such that various operating voltages are generated, and may output a select control voltage CS_A and an unselect control voltage CS_B for controlling the first switching circuit 221 and the second switching circuit 222 that correspond to a selected memory block and an unselected memory block of the memory unit 240.

When a memory block corresponding to a row address ADDR is the first memory block 241 or the second memory block 24, the block decoder 260 may generate a block pass signal BLKWL having a high-voltage level. The row address ADDR may be output from the control logic 250.

The select line control circuit 270 may include a first source select line controller 271, a first drain select line controller 272, a second source select line controller 273, and a second drain select line controller 274.

The first source select line controller 271 may be coupled to the first memory block 241, and may control the potential level of the first source select line SSL_A coupled to the first memory block 241. For example, during a read operation, if the first memory block 241 is an unselected memory block, the first source select line controller 271 may discharge the first source select line SSL_A of the first memory block 241 and thus adjust the potential level of the first source select line SSL_A to zero volts.

The first drain select line controller 272 may be coupled to the first memory block 241, and may control the potential level of the first drain select line DSL_A coupled to the first memory block 241. For example, during a read operation, if the first memory block 241 is an unselected memory block, the first drain select line controller 272 may discharge the first drain select line DSL_A of the first memory block 241 and thus adjust the potential level of the first drain select line DSL_A to zero volts.

The second source select line controller 273 may be coupled to the second memory block 242, and may control the potential level of the second source select line SSL_B coupled to the second memory block 242. For example, during a read operation, if the second memory block 242 is an unselected memory block, the second source select line controller 273 may discharge the second source select line SSL_B of the second memory block 242 and thus adjust the potential level of the second source select line SSL_B to zero volts.

The second drain select line controller 274 may be coupled to the second memory block 242, and may control the potential level of the second drain select line DSL_B coupled to the second memory block 242. For example, during a read operation, if the second memory block 242 is an unselected memory block, the second drain select line controller 274 may discharge the second drain select line DSL_B of the second memory block 242 and thus adjusts the potential level of the second drain select line DSL_B to zero volts.

The select line control circuit 270 may be controlled by the control logic 250.

Figure 5:
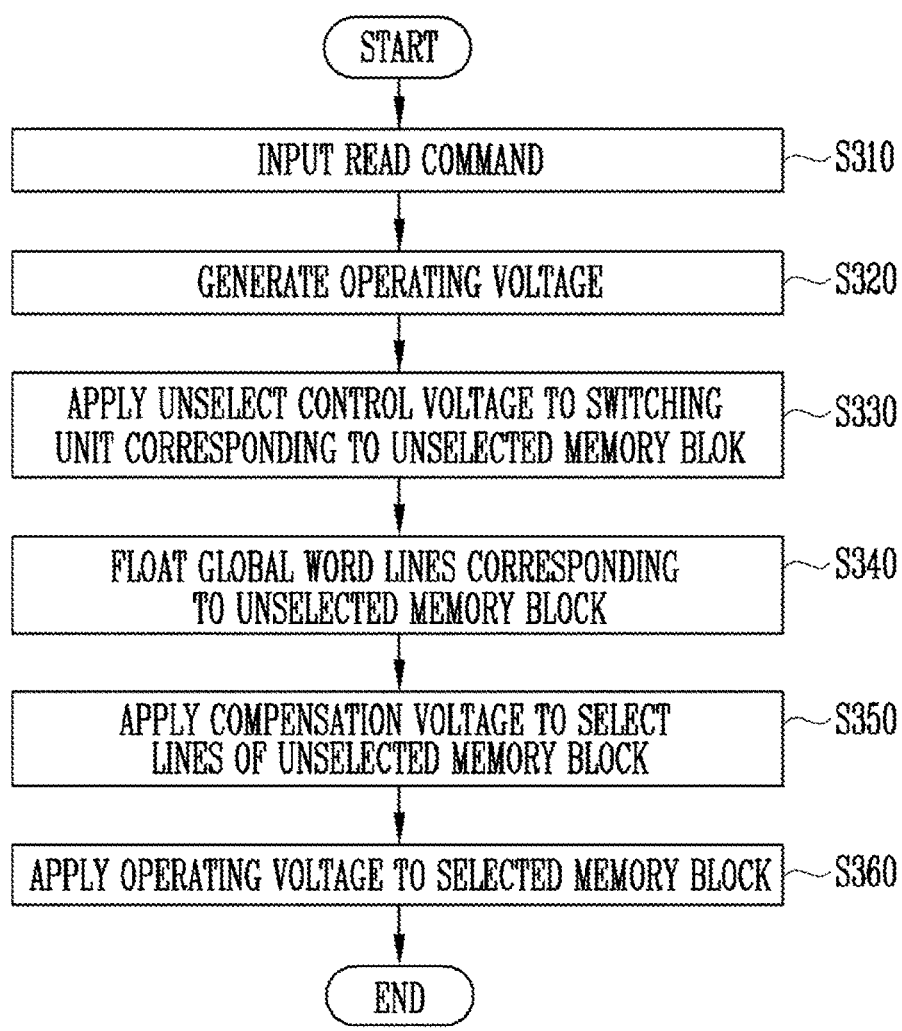
FIG. 5 is a flowchart illustrating the operation of the semiconductor memory device illustrated in FIG. 4.

FIG. 5 is a flowchart illustrating the operation of the semiconductor memory device illustrated in FIG. 4.

The operation of the semiconductor memory device according to an embodiment will be described with reference to FIGS. 4 to 5.

Here, it is assumed that the first memory block 241 is a selected memory block, which is a memory block selected the first and second memory blocks 241 and 242.

1) Inputting a Read Command (S310)

When a read command CMD related to a read operation is input from the external device, the control logic 250 may generate a control signal and control voltages for controlling the voltage generation circuit 210 and the switching circuit 220.

2) Generating Operating Voltages (S320)

The voltage generation circuit 210 may generate operating voltages having various levels for the read operation in response to control signals provided from the control logic 250. For example, the operating voltages may include a read voltage, a pass voltage, a select transistor control voltage, a compensation voltage, and so forth. The voltage generation circuit 210 may provide the operating voltages to the first global word lines GWLs_A and the first global select lines GDSL_A and GSSL_A. Furthermore, the voltage generation circuit 210 may provide a voltage of zero volts to the second global word lines GWLs_B and the second global select lines GDSL_B and GSSL_B.

3) Applying an Unselect Control Voltage to a Switching Circuit Assigned to an Unselected Memory Block An unselect control voltage CS_B is applied to the second switching circuit 222 assigned to the unselected second memory block 242. A high-voltage select control voltage CS_A output from the control logic 250 may be applied to the first switching circuit 221 assigned to the selected first memory block 241. The unselect control voltage CS_B may be set to zero volts.

4) Floating the Global Word Lines Corresponding to the Unselected Memory Block (S340)

In response to the unselect control voltage CS_B output from the control logic 250, the second switching circuit 222 corresponding to the unselected second memory block 242 may float the second-sub global word lines GWLs_B1 and the second sub-global select lines GDSL_B1 and GSSL_B1 assigned to the unselected second memory block 242. For example, the first switching circuit 221 may transmit, in response to the select control voltage CS_A of a high voltage output from the control logic 250, a plurality of operating voltages input through the first global word lines GWLs_A and the first global select lines GDSL_A and GSSL_A, to the first sub-global word lines GWLs_A1 and the first sub-global select lines GDSL_A1 and GSSL_A1. The second switching circuit 122 may be turned off in response to the unselect control voltage CS_B of zero volts, and may enable the second sub-global word lines GWLs_B1 and the second sub-global select lines GDSL_B1 and GSSL_B1 to float.

5) Applying Compensation Voltages to the Select Lines of the Unselected Memory Block (S350)

The second source select line controller 273 coupled to the unselected second memory block 242 may apply a compensation voltage to the second source select line SSL_B of the second memory block 242. The second drain select line controller 274 may apply a compensation voltage to the second drain select line DSL_B of the second memory block 242. The compensation voltage may be at zero volts.

6) Applying an Operating Voltage to the Selected Memory Block (S360)

During the read operation, a voltage of zero volts may be applied to the common source line shared by the first memory block 241 and the second memory block 242, and bit lines shared by the first memory block 241 and the second memory block 242 may be pre-charged.

In a case where the first memory block 241 is a selected memory block and the second memory block 242 is an unselected memory block, the block decoder 260 may generates a block pass signal BLKWL having a high-voltage level in response to a row address ADDR.

In response to a block pass signal BLKWL, the first pass circuit 231 may electrically couple the first sub-global word lines GWLs_A1 to first word lines WLs_A of the first memory block 241, and may electrically couple the first sub-global select lines GDSL_A1 and GSSL_A1 to the select lines DSL_A and SSL_A of the first memory block 241.

In response to a block pass signal BLKWL, the second pass circuit 232 may electrically couple the second sub-global word lines GWLs_B1 to the second word lines WLs_B of the second memory block 242, and may electrically couple the second sub-global select lines GDSL_B1 and GSSL_B1 to the second select lines DSL_B and SSL_B of the second memory block 242.

A read voltage and a pass voltage may be applied to the first word lines WLs_A of the selected first memory block 241, and a select transistor control voltage may be applied to the first select lines DSL_A and SSL_A. The second word lines WLs_B of the unselected second memory block 242 may float.

The potential levels of the floating second word lines WLs_B may be increased by capacitive coupling with adjacent wiring lines and terminals. When the potential level of the second word lines WLs_B exceeds zero volts by the capacitive coupling, a generation of hot carriers (e.g., hot holes) that may be formed due to a generation of leakage current (e.g., GIDL) in the lower channels of the drain and source select transistors may be suppressed. Therefore, a probability that hot carriers (e.g., hot holes) are injected and trapped in the channels of the unselected memory block may decrease. Furthermore, a voltage of zero volts may be applied to the second drain select line DSL_B and the source select line SSL_B of the second memory block 242 by the select line control circuit 270, so that the drain select transistors and the source select transistors of the second memory block 242 may be turned off. Therefore, leakage current flowing through the cell strings in the second memory block 242 can be reduced.

The following Table 3 shows the potential levels of the word lines and the select lines of a selected memory block and an unselected memory block among the plurality of memory blocks assigned to the pass circuits sharing one block pass signal.

TABLE 3

| | Selected memory block | | | Unselected memory block | | |
|---|---|---|---|---|---|---|
| | Sub-global line | Block pass signal | Local line | Sub-global line | Block pass signal | Local line |
| GSSL/ SSL | Vssl | High voltage | Vssl | Floating | High voltage | 0V |
| GDSL/ DSL | Vdsl | | Vdsl | Floating | | 0V |
| GWLs/ WLs | Read voltage or pass voltage | | Read voltage or pass voltage | Floating | | Floating |

As shown in Table 3, a read voltage and a pass voltage may be applied to word lines of a selected memory block, which is a memory block selected from among a plurality of memory blocks. Here, the selected memory block may be coupled to pass circuits that share a certain block pass signal. Therefore, a block pass signal may be applied to not only to the selected memory block, but also to the unselected memory block. Select transistor control voltages Vssl and Vdsl of a positive voltage may be applied to select lines of the selected memory block. As described above, the word lines of the unselected memory block may float, and a voltage of zero volts may be applied to the select lines. Thus, during a read operation of the selected memory block, in the unselected memory block, a probability that hot carriers (e.g., hot holes) are formed in a lower channel of the source select transistor may decrease, and the select transistors may be turned off, so that leakage current can be reduced.

Figure 6:
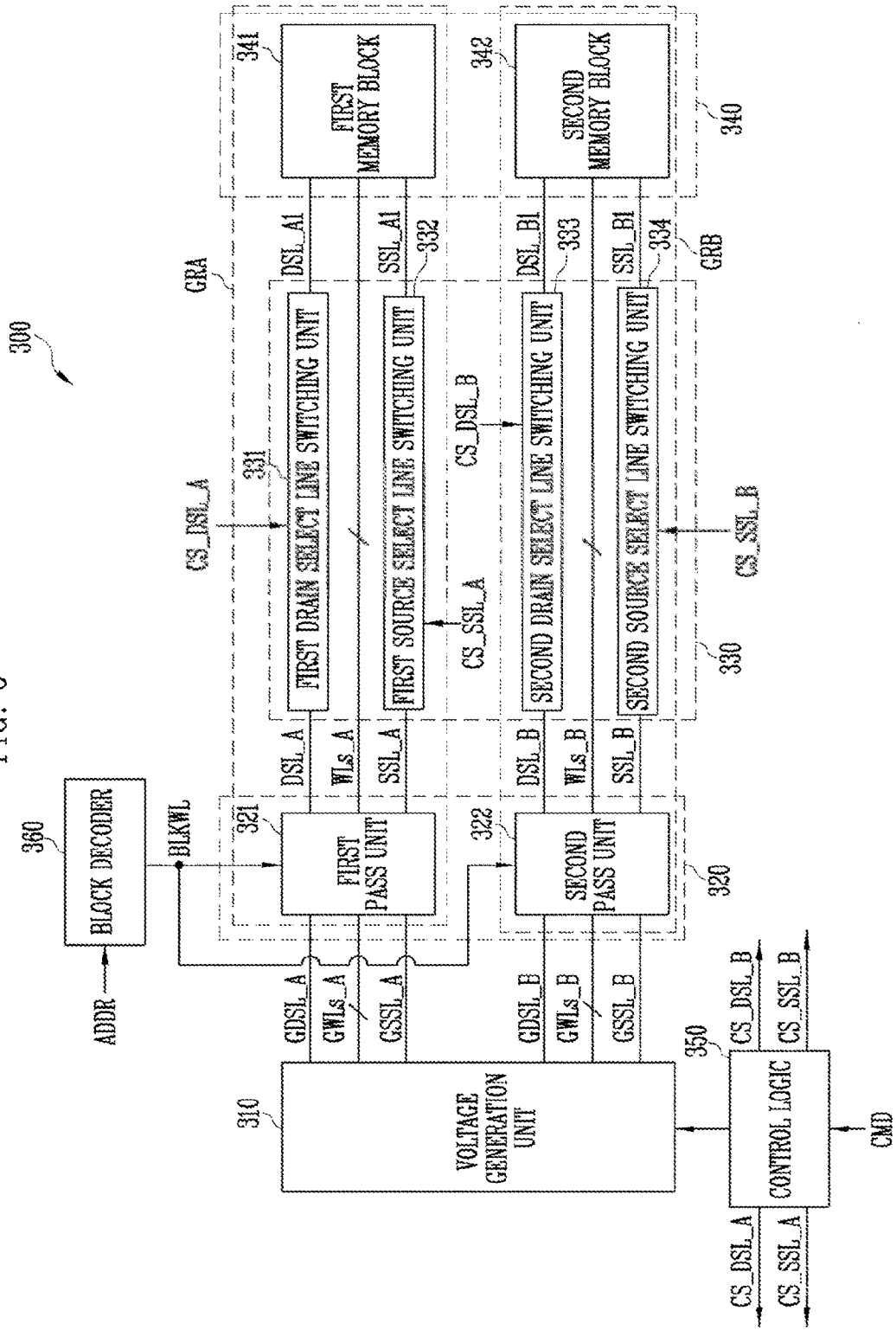
FIG. 6 is a diagram illustrating a semiconductor memory device according to an embodiment of the present disclosure.

FIG. 6 is a diagram illustrating a semiconductor memory device according to an embodiment of the present disclosure.

Referring to FIG. 6, the semiconductor memory device 300 may include a voltage generation circuit 310, a pass circuit group 320, a select line switching circuit 320, a memory unit 340, a control logic 350, and a block decoder 360.

The voltage generation circuit 310 may generate, during a read operation, operating voltages having various levels in response to an operating signal output from the control logic 350, and may output the operating voltages to global word lines and global select lines. For example, the operating voltages may include a read voltage, a pass voltage, a select transistor control voltage, a compensation voltage, and so forth. The voltage generation circuit 310 may transmit operating voltages having various levels to first global word lines GWLs_A, first global select lines GDSL_A and GSSL_A, second global word lines GWLs_B and second global select lines GDSL_B and GSSL_B. For example, in the case where a first memory block 342 is selected between the first and second memory blocks 341 and 342 of the memory unit 340, the voltage generation circuit 310 may transmit operating voltages to the first global word lines GWLs_A and the first global select lines GDSL_A and GSSL_A assigned to the first memory block 341, and may transmit a voltage of zero volts or a compensation voltage lower than the operating voltages to the second global word lines GWLs_B and the second global select lines GDSL_B and GSSL_B assigned to the unselected second memory block 342. The compensation voltage may be set within a range from zero volts to four volts.

The pass circuit group 320 may include a first pass circuit 321 and a second pass circuit 322.

In response to a block pass signal BLKWL output from the block decoder 360, the first pass circuit 321 may electrically couple the first global word lines GWLs_A to first word lines WLs_A of the first memory block 341, and may electrically couple the first global select lines GDSL_A and GSSL_A to first sub-select lines DSL_A and SSL_A corresponding to the first memory block 341.

In response to a block pass signal BLKWL output from the block decoder 360, the second pass circuit 322 may electrically couple the second global word lines GWLs_B to second word lines WLs_B of the second memory block 342, and may electrically couple the second global select lines GDSL_B and GSSL_B to second sub-select lines DSL_B and SSL_B assigned to the second memory block 342.

The first and second pass circuits 321 and 322 share a signal line carrying the block pass signal BLKWL provided from the block decoder 360. Therefore, in response to the same block pass signal BLKWL, the first global word lines GWLs_A and the first word lines WLs_A of the first memory block 341 may be electrically coupled to each other, and the first global select lines GDSL_A and GSSL_A and the first sub-select lines DSL_A and SSL_A assigned to the first memory block 341 may be electrically coupled to each other, and the second global word lines GWLs_B and the second word lines WLs_B of the second memory block 342 may be electrically coupled to each other, and the second global select lines GDSL_B and GSSL_B and the second sub-select lines DSL_B and SSL_B assigned to the second memory block 342 may be electrically coupled to each other. The first and second pass circuits 321 and 322 may include a plurality of high-voltage transistors that are turned on or off in response to the block pass signal BLKWL. Although the first and second pass circuits 321 and 322 are coupled to the same signal line providing the block pass signal BLKWL, the block pass signal BLKWL may be applied to only one of the first and second memory blocks 341 and 342 by turning on only one of the first and second switching circuits.

The select line switching circuit 330 may include a first drain select line switching circuit 331, a first source select line switching circuit 332, a second drain select line switching circuit 333, and a second source select line switching circuit 334.

The first drain select line switching circuit 331 may be coupled between a first sub-drain select line DSL_A and a first drain select line DSL_A1 of the first memory block 341, and may control the potential level of the first drain select line DSL_A1. For example, in the case where the first memory block 341 is selected between the first and second memory blocks 341 and 342 of the memory unit 340, the first drain select line switching circuit 331 may transmit, in response to a drain select control voltage CS_DSL_A output from the control logic 350, an operating voltage input through the first sub-drain select line DSL_A to the first drain select line DSL_A1 of the first memory block.

The first source select line switching circuit 332 may be coupled between a first sub-source select line SSL_A and a first source select line SSL_A1 of the first memory block 341, and may control the potential level of the first source select line SSL_A1. For example, in the case where the first memory block 341 is selected between the first and second memory blocks 341 and 342 of the memory unit 340, the first source select line switching circuit 332 may transmit, in response to a source select control voltage CS_SSL_A output from the control logic 350, an operating voltage input through the first sub-source select line SSL_A to the first source select line SSL_A1 of the first memory block.

The second drain select line switching circuit 333 may be coupled between a second sub-drain select line DSL_B and a second drain select line DSL_B1 of the second memory block 342, and may control the potential level of the second drain select line DSL_B1. For example, in the case the second memory block 342 is not selected, the second drain select line switching circuit 333 may enable the second drain select line DSL_B1 to float in response to a drain unselect control voltage CS_DSL_B output from the control logic 350.

The second source select line switching circuit 334 may be coupled between a second sub-source select line SSL_B and a second source select line SSL_B1 of the second memory block 342, and may control the potential level of the second source select line SSL_B1. For example, in the case the second memory block 342 is selected between the first and second memory blocks 341 and 342 of the memory unit 340, the second source select line switching circuit 334 may transmit, in response to a source unselect control voltage CS_SSL_B output from the control logic 350, an operating voltage input through the second sub-source select line SSL_B to the second source select line SSL_B1 of the second memory block, or floats the second source select line SSL_B1.

That is, the select line switch circuit 330 may selectively float the drain select line and the source select line of the unselected memory block.

The select line control circuit 330 may be controlled by the control logic 350.

The memory unit 340 may include the first memory block 341 and the second memory block 342. Each of the first and second memory blocks 341 and 342 may include a plurality of memory cells. For example, the plurality of memory cells may be nonvolatile memory cells. Among the plurality of memory cells, memory cells coupled to the same word line may be defined as a page. Each of the first and second memory blocks 341 and 342 may include a plurality of cell strings. The first memory block 341 and the second memory block 342 may share common source line and bit lines.

The control logic 350 may control, in response to a command CMD input from the external device, the voltage generation circuit 310 and the select line switching circuit 330. For example, when a read command pertaining to a read operation is input, the control logic 350 may control the voltage generation circuit 310 to generate various operating voltages, and may output a drain select control voltage CS_DSL_A, a source select control voltage CS_SSL_A, a drain unselect control voltage CS_DSL_B and a source unselect control voltage CS_SSL_B so as to control the first drain select line switching circuit 331, the first source select line switching circuit 332, the second drain select line switching circuit 333 and the second source select line switching circuit 334 assigned to a selected memory block and an unselected memory block of the memory unit 340.

When a memory block corresponding to a row address ADDR is the first memory block 341 or the second memory block 342, the block decoder 360 may generate a block pass signal BLKWL having a high-voltage level and outputs it. The row address ADDR may be output from the control logic 350.

A first group GRA may include the first pass circuit 321, the first drain select line switching circuit 331, the first source select line switching circuit 332, and the first memory block 341.

A second group GRB may include the second pass circuit 322, the second drain select line switching circuit 333, the second source select line switching circuit 334, and the second memory block 342.

Figure 7:
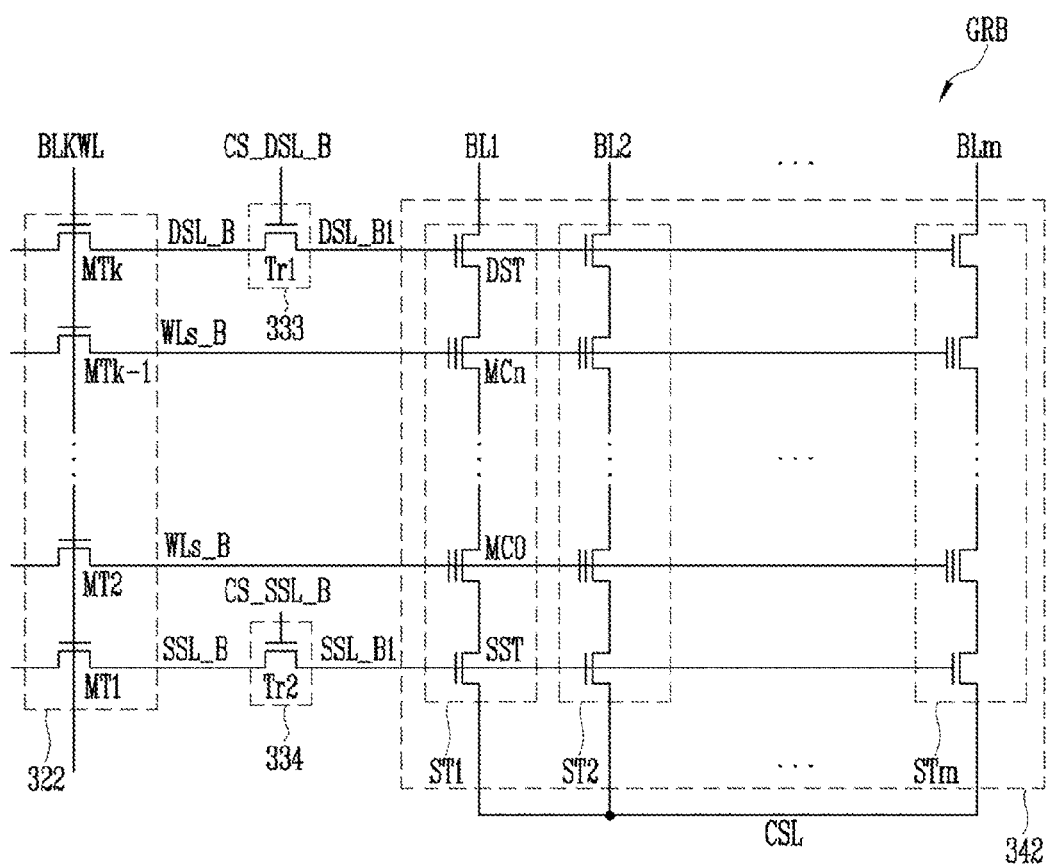
FIG. 7 is a diagram illustrating in detail a second group of the semiconductor memory device illustrated in FIG. 6.

FIG. 7 is a diagram illustrating in detail the second group of the semiconductor memory device illustrated in FIG. 6.

The first group GRA and the second group GRB of FIG. 6 may have the same structure; therefore, for the sake of convenience, only the second group GRB will be described in detail, and it is assumed that the second group GRB corresponds to an unselected memory.

The second group GRB may include the second pass circuit 322, the second drain select line switching circuit 333, the second source select line switching circuit 334, and the second memory block 342.

The second pass circuit 322 may include a plurality of high-voltage transistors that electrically couples, in response to the block pass signal BLKWL output from the block decoder 360, the second global word lines GWLs_B to the second sub-word lines WLs_B1, and electrically couples the second global select lines GDSL_B and GSSL_B to the second sub-select lines DSL_B and SSL_B.

The second drain select line switching circuit 333 may include a first transistor Tr1. The first transistor Tr1 may be coupled between the second sub-drain select line DSL_B and the second drain select line DSL_B1 of the second memory block 342, and may enable the second drain select line DSL_B1 to float in response to a drain unselect control voltage CS_DSL_B.

The second source select line switching circuit 334 may include a second transistor Tr2.

The second transistor Tr2 may be coupled between the second sub-source select line SSL_B and the second source select line SSL_B1 of the second memory block 342, and may apply, in response to a source unselect control voltage CS_SSL_B, a compensation voltage transmitted through the second source select line SSL_B1, to a gate of the source select transistor SST or may enable the second source select line SSL_B to float.

For example, in the case where the second memory block 342 is an unselected memory block during a read operation, the first transistor Tr1 and the second transistor Tr2 may be turned off respectively in response to a drain unselect control voltage CS_DSL_B and a source unselect control voltage CS_SSL_B. As a result, the second drain select line DSL_B1 and the second source select line SSL_B1 may float. The drain unselect control voltage CS_DSL_B and the source unselect control voltage CS_SSL_B may be voltages of zero volts.

In another example, when the second memory block 342 is an unselected memory block during a read operation, the first transistor Tr1 may be turned off in response to a drain unselect control voltage CS_DSL_B, and thus the second select line DSL_B1 may float. The second transistor Tr2 may be turned on in response to a source unselect control voltage CS_SSL_B, and may apply a compensation voltage of 0V transmitted through the second source select line SSL_B, to the gate of the source select transistor SST to turn off the source select transistor SST. The drain unselect control voltage CS_DSL_B may be a voltage of zero volts, and the source unselect control voltage CS_SSL_B may be a voltage ranging from zero volts to four volts.

The second memory block 342 may include a plurality cell strings ST1 to STm which are respectively coupled between a common source line CSL and a plurality of bit liens BL1 to BLm.

The plurality of cell strings ST1 to STm may have the same structure as one another. The first cell string ST1 may include a source select transistor SST, a plurality of memory cells MC0 to MCn and a drain select transistor DST, which are coupled in series between the common source line CSL and the bit line BL1. Gates of the plurality of memory cells MC0 to MCn may be coupled to the respective second word lines WLs_B.

Figure 8:
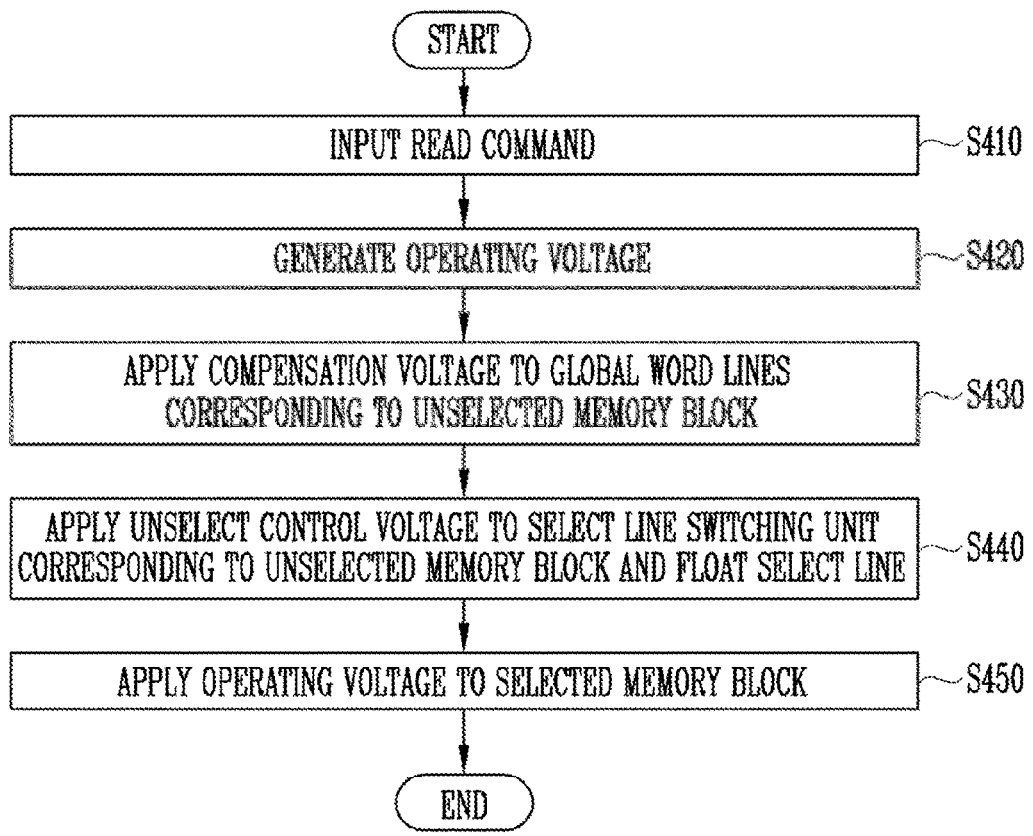
FIG. 8 is a flowchart illustrating the operation of the semiconductor memory device illustrated in FIG. 6.

FIG. 8 is a flowchart illustrating the operation of the semiconductor memory device illustrated in FIG. 6.

The operation of the semiconductor memory device according to an embodiment will be described with reference to FIGS. 6, 7 and 8.

Here, it is assumed that the first memory block 341 is selected between the first and second memory blocks 141 and 142 for a read operation.

1) Inputting a Read Command (S410)

When a read command CMD related to a read operation is input from the external device, the control logic 350 may generate a control signal and control voltages for controlling the voltage generation circuit 310 and the switching circuit 330.

2) Generating Operating Voltages (S420)

The voltage generation circuit 310 may generate operating voltages having various levels for the read operation in response to control signals provided from the control logic 350. For example, the operating voltages may include a read voltage, a pass voltage, a select transistor control voltage, a compensation voltage, and so forth. The voltage generating circuit 310 may provide the read voltage, the pass voltage, the select transistor control voltage, etc. to the first global word lines GWLs_A and the first global select lines GDSL_A and GSSL_A. Furthermore, the voltage generation circuit 310 may provide compensation voltages to the second global word lines GWLs_B and the second global select lines GDSL_B and GSSL_B.

3) Applying Compensation Voltages to Global Word Lines and Global Select Lines Corresponding to an Unselected Memory Block (S430)

The voltage generation circuit 310 may apply compensation voltages to the second global word lines GWLs_B and global select lines GDSL_B and GSSL_B assigned to the unselected second memory block 342. For example, the voltage generation circuit 310 may apply operating voltages to the first global word lines GWLs_A and the first global select lines GDSL_A and GSSL_A assigned to the selected first memory block 341. The voltage generation circuit 310 may apply compensation voltages to the second global word lines GWLs_B and the second global select lines GDSL_B and GSSL_B, which are assigned to the unselected second memory block 342. A compensation voltage applied to the second global word lines GWLs_B may be a positive voltage, and, for example, may be set within a range from zero volts to four volts. A compensation voltage applied to the second global select lines GDSL_B and GSSL_B may be a voltage of zero volts.

4) Applying an Unselect Control Voltage to the Select Line Switching Circuit Assigned to the Unselected Memory Block and Floating the Select Line (S440)

A drain unselect control voltage CS_DSL_B and a source unselect control voltage CS_SSL_B may be respectively applied to the second drain select line switching circuit 333 and the second source select line switching circuit 334, which are assigned to the unselected second memory block 342. In this case, a drain select control voltage CS_DSL_A of a high voltage output from the control logic 350 may be applied to the first drain select line switching circuit 331 assigned to the first memory block 341. A source select control voltage CS_SSL_A of a high voltage which is output from the control logic 350 may be applied to the first source select line switching circuit 332. A drain unselect control voltage CS_DSL_B of zero volts output from the control logic 350 may be applied to the second drain select line switching circuit 333 assigned to the unselected second memory block 342. A source unselect control voltage CS_SSL_B of zero volts output from the control logic 350 may be applied to the second source select line switching circuit 334. As a result, the second drain select line DSL_B1 and the second source select line SSL_B1 may float.

5) Applying an Operating Voltage to a Selected Memory Block (S450)

During the read operation, a voltage of zero volts may be applied to the common source line shared by the first memory block 341 and the second memory block 342, and bit lines shared by the first memory block 341 and the second memory block 342 may be pre-charged.

In a case where the first memory block 341 is a selected memory block and the second memory block 342 is an unselected memory block, the block decoder 360 may generate a block pass signal BLKWL having a high-voltage level in response to a row address ADDR.

In response to a block pass signal BLKWL, the first pass circuit 321 may electrically couple the first global word lines GWLs_A to first word lines WLs_A of the first memory block 341, and may electrically couple the first global select lines GDSL_A and GSSL_A to the first sub-select lines DSL_A and SSL_A.

In response to a block pass signal BLKWL, the second pass circuit 322 may electrically couple the second global word lines GWLs_B to second word lines WLs_B of the second memory block 342, and may electrically couple the second global select lines GDSL_B and GSSL_B to the second sub-select lines DSL_B and SSL_B.

A read voltage and a pass voltage may be applied to the first word lines WLs_A of the selected first memory block 341, and a select transistor control voltage may be applied to the first select lines DSL_A1 and SSL_A1. A compensation voltage ranging from zero volts to four volts may be applied to the second word lines WLs_B of the unselected second memory block 342, and a compensation voltage of zero volts may be applied to the second select lines DSL_B1 and SSL_B1. As a result, the second select lines DSL_B1 and SSL_B1 of the unselected second memory block 342 may float.

The potential levels of the floating second select lines DSL_B and SSL_B may be increased by capacitive coupling with adjacent wiring lines and terminals. In the case where the potential levels of the second word lines WLs_B and the second select lines DSL_B1 and SSL_B1 exceed zero volts by the capacitive coupling phenomenon, a generation of hot carriers (e.g., hot holes) that may be formed due to the generation of leakage current (e.g., GIDL) in the channels of the drain and source select transistors may be suppressed. Therefore, a probability that hot carriers (e.g., hot holes) are injected and trapped in the channel of the unselected memory block may decrease, and leakage current flowing through the cell strings in the second memory block 342 may be reduced.

The following 'Table 4' shows potential levels of the word lines and the select lines of a selected memory block and an unselected memory block among the plurality of memory blocks that assigned to the pass circuits sharing one block pass signal.

TABLE 4

|  | Selected memory block | | | Unselected memory block | | |
| --- | --- | --- | --- | --- | --- | --- |
|  | Sub-global line | Block pass signal | Local line | Sub-global line | Block pass signal | Local line |
| GSSL/SSL | Vssl | High voltage | Vssl | 0V | High voltage | 0V or floating |
| GDSL/DSL | Vdsl |  | Vdsl | 0V |  | floating |
| GWLs/WLs | Read voltage or pass voltage |  | Read voltage or pass voltage | 0V or compensation voltage |  | 0V or compensation voltage |

As shown in Table 4, a read voltage and a pass voltage may be applied to word lines of a selected memory block, which is a memory block selected from among a plurality of memory blocks. Here, the selected memory block may be coupled to pass circuits that share a certain block pass signal. Therefore, a block pass signal may be applied to not only to the selected memory block, but also to the unselected memory block. A select transistor control voltage of 5.5 volts may be applied to select lines of the selected memory block. As described above, zero volts or a compensation voltage may be applied to the word lines of the unselected memory block, and a compensation voltage of zero volts may be applied to the select lines, or the select lines may float. Therefore, during a read operation of the selected memory block, in the unselected memory block, a probability that hot carriers (e.g., hot holes) are formed in the lower channels of the drain and source select transistors may decrease, and a probability that hot carriers (e.g., hot holes) are injected and trapped in the channel of the memory block may decrease. In addition, leakage current flowing through the cell strings in the second memory block 342 may be reduced.

Figure 9:
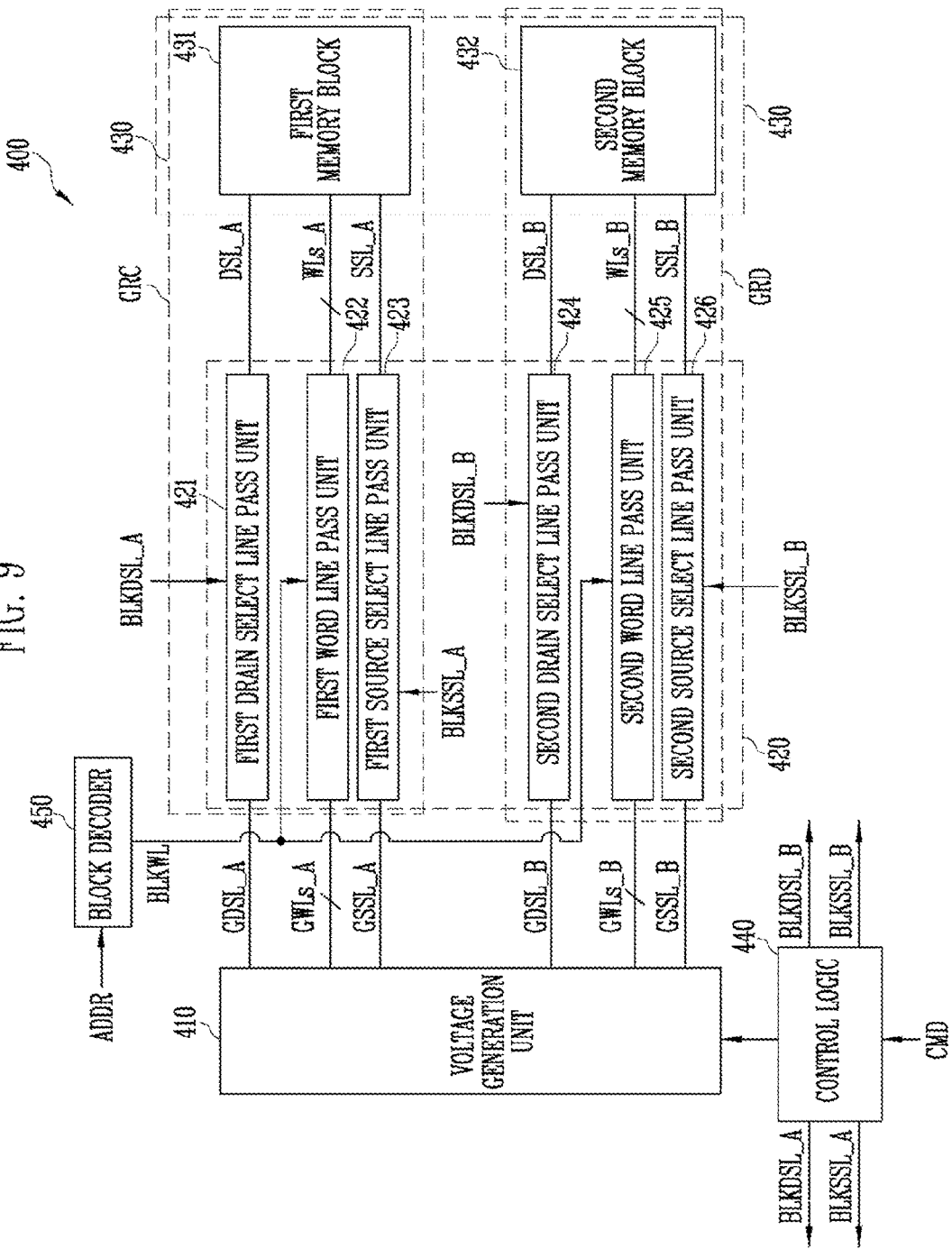
FIG. 9 is a diagram illustrating a semiconductor memory device according to an embodiment of the present disclosure.

FIG. 9 is a diagram illustrating a semiconductor memory device according to an embodiment of the present disclosure.

Referring to FIG. 9, the semiconductor memory device 400 may include a voltage generation circuit 410, a pass circuit 420, a memory unit 430, a control logic 440, and a block decoder 450.

The voltage generation circuit 410 may generate, during a read operation, operating voltages having various levels in response to an operating signal output from the control logic 440, and may output the operating voltages to global word lines and global select lines. For example, the operating voltages may include a read voltage, a pass voltage, a select transistor control voltage, a compensation voltage, and so forth. The voltage generation circuit 410 may transmit operating voltages having various levels to first global word lines GWLs_A, first global select lines GDSL_A and GSSL_A, second global word lines GWLs_B and second global select lines GDSL_B and GSSL_B. For example, in the case where a first memory block 431 is selected between the first and second memory blocks 431 and 432 of the memory unit 430, the voltage generation circuit 410 may transmit operating voltages to the first global word lines GWLs_A and the first global select lines GDSL_A and GSSL_A assigned to the first memory block 341, and may transmit a voltage of zero volts or a compensation voltage lower than the operating voltages to the second global word lines GWLs_B and the second global select lines GDSL_B and GSSL_B assigned to the unselected second memory block 342. The compensation voltage may be set within a range from zero volts to four volts.

The pass circuit group 420 may include a first drain select line pass circuit 421, a first word line pass circuit 422, a first source select line pass circuit 423, a second drain select line pass circuit 424, a second word line pass circuit 425, and a second source select line pass circuit 426.

The first drain select line pass circuit 421 may be coupled between a first global drain select line GDSL_A and a first drain select line DSL_A of the first memory block 431, and may control the potential level of the first drain select line DSL_A. For example, in the case where the first memory block 431 is selected between the first and second memory blocks 431 and 432 of the memory unit 430, the first drain select line pass circuit 421 may transmit, in response to a block drain select control voltage BLKDSL_A output from the control logic 440, an operating voltage applied thereto through the first global drain select line GDSL_A, to the first drain select line DSL_A of the first memory block 431.

The first word line pass circuit 422 may be coupled between the first global word lines GWLs_A and first word lines WLs_A of the first memory block 431, and may control the potential level of the first word lines WLs_A. For example, in the case where the first memory block 431 is selected between the first and second memory blocks 431 and 432 of the memory unit 430, the first word line pass circuit 422 may transmit, in response to a block pass signal BLKWL output from the block decoder 450, operating voltages input thereto through the first global word lines GWLs_A, to the first word lines WLs_A of the first memory block 431.

The first source select line pass circuit 423 may be coupled between a first source select line GSSL_A and a first source select line SSL_A of the first memory block 431, and may control the potential level of the first source select line SSL_A. For example, in the case where the first memory block 431 is selected between the first and second memory blocks 431 and 432 of the memory unit 430, the first source select line pass circuit 423 may transmit, in response to a block source select control voltage BLKSSL_A output from the control logic 440, an operating voltage input thereto through the first global source select line GSSL_A, to the first source select line SSL_A of the first memory block 431.

The second drain select line pass circuit 424 may be coupled between a second global drain select line GDSL_B and a second drain select line DSL_B of the second memory block 432, and may control the potential level of the second drain select line DSL_B. For example, in the case where an unselected memory block of the first and second memory blocks 431 and 432 of the memory unit 430 is the second memory block 432, the second drain select line pass circuit 424 floats the second drain select line DSL_B in response to a block drain unselect control voltage BLKDSL_B output from the control logic 440.

The second word line pass circuit 425 is coupled between the second global word lines GWLs_B and second word lines WLs_B of the second memory block 432 and controls the potential level of the second word lines WLs_B. For example, in the case where the second memory block 432 is the unselected memory block of the memory unit 430, the second word line pass circuit 425 may transmit, in response to a block pass signal BLKWL output from the block decoder 450, compensation voltages input thereto through the second global word lines GWLs_B, to the second word lines WLs_B of the second memory block 432.

The second source select line pass circuit 426 may be coupled between a second source select line GSSL_B and a second source select line SSL_B of the second memory block 432, and may control the potential level of the second source select line SSL_B. For example, in the case where the second memory block 432 is the selected memory block of the memory unit 430, the second source select line pass circuit 426 may transmit, in response to a block source unselect control voltage BLKSSL_B output from the control logic 440, a compensation voltage input thereto through the second global source select line GSSL_B, to the second source select line SSL_B of the second memory block 432, or may enable the second source select line SSL_B to float.

That is, the pass circuit 420 may selectively float the drain select line and the source select line of the unselected memory block.

The first and second drain select line pass circuits 421 and 424 and the first and second source select line pass circuits 423 and 426 of the pass circuit 420 may be controlled by the control logic 350. The first and second word line pass circuits 422 and 425 of the pass circuit 420 may be controlled by the block decoder 450.

The first and second drain select line pass circuits 421 and 424, the first and second source select line pass circuits 423 and 426, and the first and second word line pass circuits 422 and 425 of the pass circuit 420 may include a plurality of high-voltage transistors.

The memory unit 430 may include the first memory block 431 and the second memory block 432. Each of the first and second memory blocks 431 and 432 may include a plurality of memory cells. In an embodiment, the plurality of memory cells may be nonvolatile memory cells. Among the plurality of memory cells, memory cells coupled to the same word line are defined as a page. Each of the first and second memory blocks 431 and 432 may include a plurality of cell strings.

The first memory block 431 and the second memory block 432 may share common source line and bit lines.

The control logic 440 may control, in response to a command CMD input from the external device, the voltage generation circuit 410, and the first and second drain select line pass circuits 421 and 424 and the first and second source select line pass circuits 423 and 426 of the pass circuit 420. For example, in response to a read command pertaining to a read operation, the control logic 440 may control the voltage generation circuit 410 to generate various operating voltages. Furthermore, the control logic 440 may output a block drain select control voltage BLKDSL_A, a block source select control voltage BLKSSL_A, a block drain unselect control voltage BLKDSL_B and a block source unselect control voltage BLKSSL_B so as to control the first and second drain select line pass circuits 421 and 424 and the first and second source select line pass circuit 423 and 426, which are assigned to a selected memory block and an unselected memory block of the memory unit 430.

The block decoder 450 may generate, when a memory block corresponding to a row address ADDR is the first memory block 431 or the second memory block 432, a block pass signal BLKWL having a high-voltage level. The row address ADDR may be output from the control logic 440.

A third group GRC may include the first drain select line pass circuit 421, the first word line pass circuit 422, the first source select line pass circuit 423, and the first memory block 431.

A fourth group GRD may include the second drain select line pass circuit 424, the second word line pass circuit 425, the second source select line pass circuit 426, and the second memory block 432.

Figure 10:
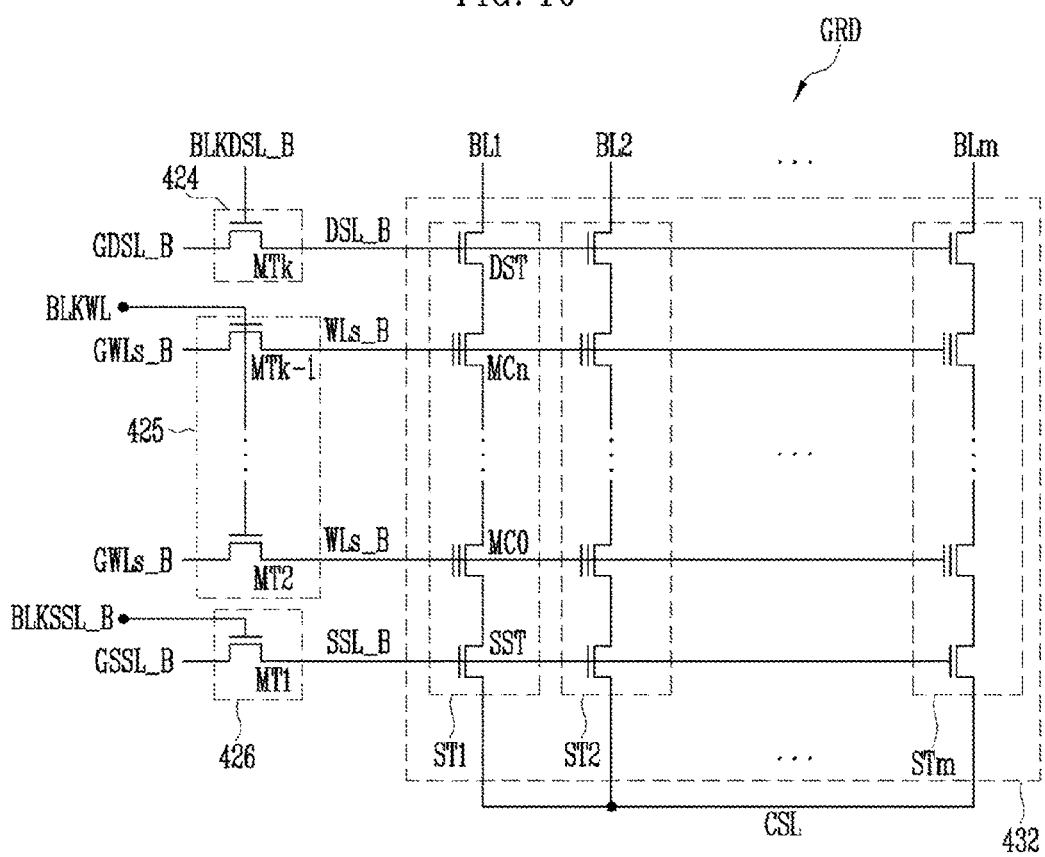
FIG. 10 is a diagram illustrating in detail a fourth group of the semiconductor memory device illustrated in FIG. 9.

FIG. 10 is a diagram illustrating in detail the fourth group of the semiconductor memory device illustrated in FIG. 9.

The third group GRC and the fourth group GRD of FIG. 9 may have the same structure; therefore, for the sake of convenience, only the fourth group GRD will be described in detail, and it is assumed that the fourth group GRD corresponds to an unselected memory.

A fourth group GRD may include the second drain select line pass circuit 424, the second word line pass circuit 425, the second source select line pass circuit 426, and the second memory block 432.

The second drain select line pass circuit 424, the second word line pass circuit 425 and the second source select line pass circuit 426 may include first to $k^{th}$ transistors MT1 to MTk. For example, the second source select line pass circuit 426 may include the first transistor MT1. The second word line pass circuit 425 may include second to $(k-1)^{th}$ transistors MT2 to MTk−1. The second drain select line pass circuit 424 may include a $k^{th}$ transistor MTk.

The first transistor MT1 may couple or decouple, in response to a block source unselect control voltage BLKSSL_B, the second global source select line GSSL_B and the second source select line SSL_B to or from each other. The second to $(k-1)^{th}$ transistors MT2 to MTk−1 may couple or decouple, in response to a block pass signal BLKWL, the second global word lines GWLs_B and the second word lines WLs_B to or from each other. The $k^{th}$ transistor MTk couples or decouples, in response to a block drain unselect control voltage BLKDSL_B, the second global drain select line GDSL_B and the second drain select line DSL_B to or from each other.

During a read operation of a selected memory block, the first and $k^{th}$ transistors MT1 and MTk may be turned off in response to a block source unselect control voltage BLKSSL_B and a block drain unselect control voltage BLKDSL_B, and the second to k−1 transistors MR2 to MTk−1 may be turned on in response to a block pass signal BLKWL. Accordingly, the second source select line SSL_B and the second drain select line DSL_B may float, and voltages applied to the second global word lines GWLs_B may be transmitted to the second word lines WLs_B. For example, in the case where the second global word lines GWLs_B are lines assigned to an unselected memory block, a voltage of zero volts may be applied to the second global word lines GWLs_B, and thus a voltage of zero volts may also be transmitted to the second word lines WLs_B.

The second memory block 432 includes a plurality cell strings ST1 to STm which are respectively coupled between a common source line CSL and a plurality of bit liens BL1 to BLm.

The plurality of cell strings ST1 to STm may have the same structure. The first cell string ST1 may include a source select transistor SST, a plurality of memory cells MC0 to MCn and a drain select transistor DST which are coupled in series between the common source line CSL and the bit line BL1. Gates of the plurality of memory cells MC0 to MCn are coupled to the respective second word lines WLs_B.

Figure 11:
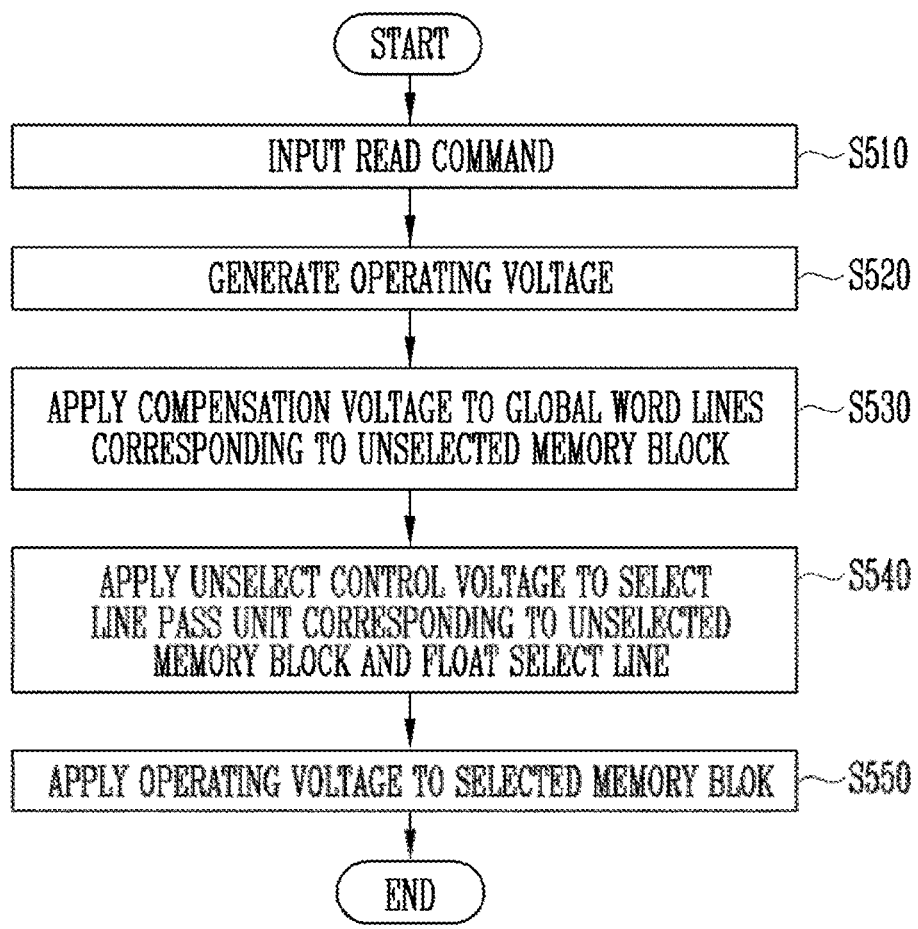
FIG. 11 is a flowchart illustrating the operation of the semiconductor memory device illustrated in FIG. 9.

FIG. 11 is a flowchart illustrating the operation of the semiconductor memory device illustrated in FIG. 9.

The operation of the semiconductor memory device according to the present embodiment will be described with reference to FIGS. 9, 10 and 11.

Here, it is assumed that, between the first and second memory blocks 431 and 432, the first memory block 431 is a selected memory block and the second memory block 432 is an unselected memory block.

1) Inputting a Read Command (S510)

When a read command CMD related to a read operation is input from the external device, the control logic 440 generates a control signal and control voltages for controlling the voltage generation circuit 410 and the pass circuit 420.

2) Generating Operating Voltages (S520)

The voltage generation circuit 410 may generates operating voltages having various levels for the read operation in response to control signals provided from the control logic 440. For example, the operating voltages may include a read voltage, a pass voltage, a select transistor control voltage, a compensation voltage, and so forth. The voltage generating circuit 310 may provide the read voltage, the pass voltage, the select transistor control voltage, etc. to the first global word lines GWLs_A and the first global select lines GDSL_A and GSSL_A. Furthermore, the voltage generation circuit 410 may provide compensation voltages to the second global word lines GWLs_B and the second global select lines GDSL_B and GSSL_B.

3) Applying Compensation Voltages to Global Word Lines Corresponding to an Unselected Memory Block (S530)

The voltage generation circuit 410 may apply compensation voltages to the second global word lines GWLs_B that assigned to the unselected second memory block 432. For example, the voltage generation circuit 410 may apply operating voltages to the first global word lines GWLs_A and the first global select lines GDSL_A and GSSL_A assigned to the selected first memory block 431. The voltage generation circuit 410 may apply a compensation voltage of zero volts to the second global word lines GWLs_B assigned to the unselected second memory block 432.

4) Applying an Unselect Control Voltage to a Select Linen Pass Circuit Assigned to the Unselected Memory Block and Floating the Select Line (S540)

A block drain unselect control voltage BLKDSL_B and a block source unselect control voltage BLKSSL_B may be respectively applied to the second drain select line pass circuit 424 and the second source select line pass circuit 426, which are assigned to the unselected second memory block 432. The block drain unselect control voltage BLKDSL_B and the block source unselect control voltage BLKSSL_B may be voltages of zero volts. As a result, the second drain select line DSL_B and the second source select line SSL_B may float.

5) Applying an Operating Voltage to the Selected Memory Block (S550)

During the read operation, a voltage of zero volts may be applied to the common source line shared by the first memory block 431 and the second memory block 432, and bit lines shared by the first memory block 341 and the second memory block 342 may be pre-charged.

In a case where the first memory block 431 is a selected memory block and the second memory block 432 is an unselected memory block, the block decoder 450 may generate a block pass signal BLKWL having a high-voltage level in response to a row address ADDR. Since the block pass signal BLKWL is applied in common to the first and second word line pass circuits 422 and 425, the first global word lines GWLs_A may be electrically coupled to the first word lines WLs_A, and the second global word lines GWLs_B may be electrically coupled to the second word lines WLs_B.

The potential levels of the floating select lines DSL_B and SSL_B may be increased by capacitive coupling with adjacent wiring lines and terminals. In the case where the potential level of the select lines DSL_B and SSL_B exceeds zero volts by the capacitive coupling phenomenon, a generation of hot carriers (e.g., hot holes) that may be formed due to generation of leakage current (e.g., GIDL) in the channels of the drain and source select transistors may be suppressed. Therefore, a probability that hot carriers (e.g., hot holes) are injected and trapped in the channel of the unselected memory block may decrease, and leakage current flowing through the cell strings in the second memory block 432 may be reduced.

Figure 12:
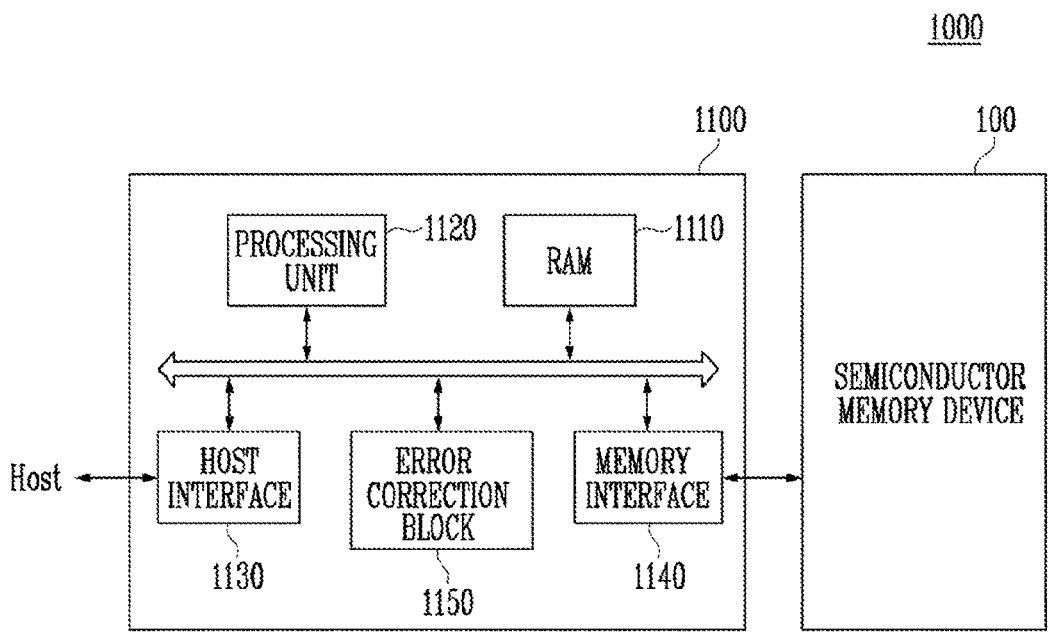
FIG. 12 is a diagram illustrating a memory system including a semiconductor memory device according to an embodiment of the present disclosure.

FIG. 12 is a diagram illustrating a memory system including a semiconductor memory device according to an embodiment of the present disclosure.

Referring to FIG. 12, the memory system 1000 may include the semiconductor memory device 100 and a controller 1100.

The semiconductor memory device 100 may be the same as the semiconductor memory device described with FIG. 1, 4, 6 or 9; therefore, any repetitive detailed description will be omitted or simplified.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (random access memory) 1110, a processing circuit 1120, a host interface 1130, a memory interface 1140, and an error correction block 1150. The RAM 1110 is used as at least one of an operation memory of the processing circuit 1120, a cache memory between the semiconductor memory device 100 and the host Host, and a buffer memory between the semiconductor memory device 100 and the host Host. The processing circuit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correction code (ECC) to detect and correct an error in data received from the semiconductor memory device 100. The processing circuit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 13:
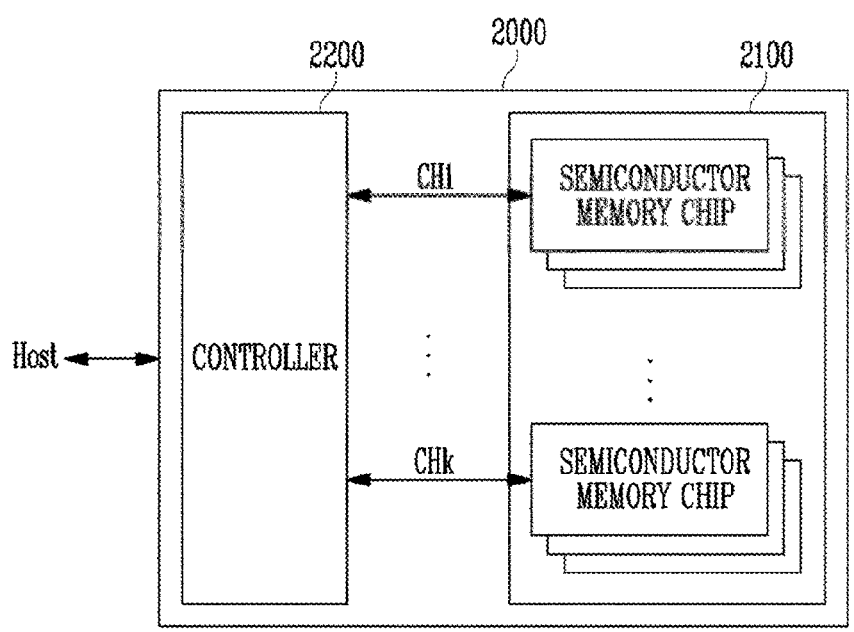
FIG. 13 is a diagram illustrating an application example of the memory system of FIG. 12.

FIG. 13 is a diagram illustrating an application example of the memory system of FIG. 12.

Referring FIG. 13, the memory system 2000 may include a semiconductor memory device 2100 and a controller 2200. The semiconductor memory device 2100 may include a plurality of memory chips. The semiconductor memory chips may be divided into a plurality of groups.

In FIG. 13, it is illustrated that each of the plurality of groups communicates with the controller 2200 through first to $k^{th}$ channels CH1 to CHk. Each semiconductor memory chip may have the same configuration as those of any one of the semiconductor memory devices 100, 200, 300 and 400 described with reference to FIG. 1, 4, 6 or 9.

Each group may communicate with the controller 2200 through one common channel. The controller 2200 may have the same configuration as that of the controller 1100 described with reference to FIG. 12, and may control a plurality of memory chips of the semiconductor memory device 2100 through the plurality of channels CH1 to CHk.

Figure 14:
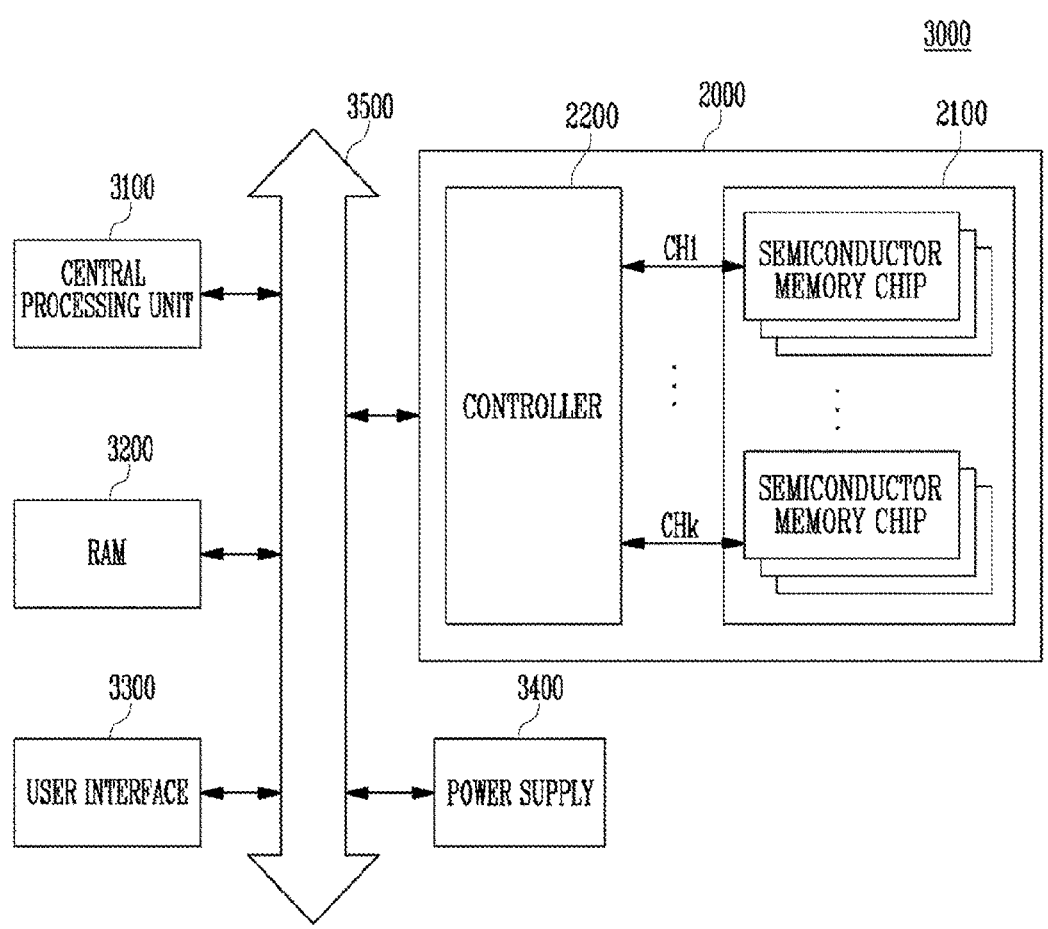
FIG. 14 is a diagram illustrating a computing system including the memory system illustrated with reference to FIG. 13.

FIG. 14 is a diagram illustrating a computing system including the memory system illustrated with reference to FIG. 13.

Referring to FIG. 14, the computing system 3000 may include a central processing circuit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 14, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 14, it is illustrated that the memory system 2000 described with reference to FIG. 13 is used. However, the memory system 2000 may be replaced with the memory system 1000 described with reference to FIG. 12. In an embodiment, the computing system 3000 may include all of the memory systems 1000 and 2000 described with reference to FIGS. 12 and 13.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A method of operating a semiconductor memory device, comprising:
   performing a read operation on a selected memory block;
   coupling local word lines of the selected memory block to first sub-global word lines and local word lines of unselected memory blocks to second sub-global word lines in response to one block pass signal during the read operation; and
   during the read operation, enabling local select lines coupled to the unselected memory blocks to float so that potential levels of local word lines coupled to the unselected memory blocks are increased.

2. The method according to claim 1, wherein, in order to enable the local select lines coupled to the unselected memory blocks to float, global select lines are blocked from sub-global select lines coupled to the local select lines.

3. The method according to claim 1, further comprising:
when the local select lines coupled to the unselected memory blocks are floating, decoupling global word lines and the second sub global word lines from each other so that the local word lines coupled to the unselected memory blocks are floating.

4. The method according to claim 3, wherein a voltage applied to the global select lines coupled to the unselected memory blocks is identical to a voltage applied to the global select lines coupled to the selected memory block, and a voltage applied to the global word lines coupled to the unselected memory blocks is identical to a voltage applied to the global word lines coupled to the selected memory block.

5. The method according to claim 1, further comprising:
when the local select lines are floated, pulling the local word lines coupled to the unselected memory block to ground.

6. The method according to claim 5, wherein pulling the local word lines coupled to the unselected memory block to ground comprises:
pulling global word lines coupled to the unselected memory blocks to ground; and
coupling the global word lines coupled to the unselected memory blocks, the second sub global word lines and the local word lines coupled to the unselected memory blocks to each other.

7. The method according to claim 1, further comprising:
pulling some of the local select lines coupled to the unselected memory blocks to ground.

8. The method according to claim 7, wherein, among the local select lines coupled to the unselected memory blocks, local drain select lines are floating, and local source select lines are pulled to ground.

9. A method of operating a semiconductor memory device, comprising:
performing a read operation of a selected memory block;
coupling local word lines of the selected memory block to first sub-global word lines and local word lines of unselected memory blocks to second sub-global word lines in response to one block pass signal during the read operation; and
during the read operation, pulling local select lines coupled to unselected memory blocks to ground.

10. The method according to claim 9, wherein pulling local select lines coupled to unselected memory blocks to ground comprises:
pulling global select lines coupled to the unselected memory blocks to ground; and
coupling the global select lines and the local select lines that are coupled to the unselected memory blocks to each other.

11. The method according to claim 9, further comprising, when the local select lines coupled to the unselected memory blocks are pulled to ground, applying a compensation voltage to local word lines coupled to the unselected memory blocks.

12. The method according to claim 11, wherein the compensation voltage is set to be a positive voltage.

13. The method according to claim 9, further comprising, pulling the local select lines coupled to the unselected memory blocks to ground, decoupling the local select lines and global select lines that are coupled to the unselected memory blocks, from each other.

14. A semiconductor memory device comprising:
a plurality of memory blocks;
local select lines and local word lines coupled to the respective memory blocks;
a voltage generation circuit configured to output operating voltage of various levels to global select lines and global word lines;
select line pass circuits configured to selectively couple or decouple the global select lines and the local select lines;
word line pass circuits configured to couple or decouple, in common, the global word lines and the local word lines in response to a block pass signal;
a block decoder configured to generate the block pass signal for controlling the word line pass circuits in common ; and
a control logic configured to control, in response to a command, the voltage generation circuit, the select line pass circuits, and the block decoder.

15. The semiconductor memory device according to claim 14, wherein the voltage generation circuit is coupled to the select line pass circuits through the global select lines and coupled to the word line pass circuits through the global word lines.

16. The semiconductor memory device according to claim 15, wherein, during a read operation of a selected memory block among the memory blocks, the voltage generation circuit pulls, among the global select lines and the global word lines, global select lines and global word lines assigned to unselected memory blocks to ground.

17. The semiconductor memory device according to claim 14, wherein the control logic is configured to output, in response to the command, an operating signal for controlling the voltage generation circuit, control voltages for controlling the select line pass circuits, and a block pass signal for controlling the block decoder.

18. The semiconductor memory device according to claim 14, wherein, during a read operation of a selected memory block among the memory blocks, the control logic controls the select line pass circuits such that the local select lines and the global select lines that are coupled to unselected memory blocks are decoupled from each other.

19. The semiconductor memory device according to claim 14, wherein, during a read operation of a selected memory block among the memory blocks, the control logic controls the word line pass circuits such that local word lines and global word lines that are coupled to unselected memory blocks are coupled from each other.

* * * * *